(12) United States Patent
Iwashita

(10) Patent No.: US 7,888,971 B2
(45) Date of Patent: Feb. 15, 2011

(54) VERIFICATION SUPPORT SYSTEM AND METHOD

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/696,755

(22) Filed: Jan. 29, 2010

(65) Prior Publication Data

US 2010/0194436 A1 Aug. 5, 2010

(30) Foreign Application Priority Data

Jan. 30, 2009 (JP) ............................. 2009-019651

(51) Int. Cl.
*H03K 19/096* (2006.01)
(52) U.S. Cl. .............................. 326/93; 326/94; 326/31
(58) Field of Classification Search ............. 326/93–94, 326/21, 31
See application file for complete search history.

(56) References Cited

U.S. PATENT DOCUMENTS 6,529,033 B1 * 3/2003 Park et al. ..................... 326/16
7,583,106 B2 * 9/2009 Cumming et al. .............. 326/93
7,701,255 B2 * 4/2010 Cortadella et al. ............ 326/93

OTHER PUBLICATIONS

Litterick, Mark "Pragmatic Simulation-Based Verification of Clock Domain Crossing Signals and Jitter using System Verilog Assertions" *DVCon 2006, Paper 9.1* Feb. 22, 2006, pp. 1-6.
Sabbagh, Roger et al., "Does Your Simulation Model Metastability Effects Completely and Accurately?", *DVCon 2008, Paper 8.2* Feb. 21, 2008.

* cited by examiner

*Primary Examiner*—James Cho
(74) *Attorney, Agent, or Firm*—Fujitsu Patent Center

(57) ABSTRACT

A verification support system for supporting logic verification of a circuit including a transmitter clock domain and a receiver clock domain, the transmitter clock domain, the system includes a detector for receiving data to be transmitted from the transmitter clock domain, and for detecting a fluctuation of the received data due to any timing fluctuation responsive to the transmitter clock. The system includes an identification unit to identify whether or not any fluctuation of the data determined by the detector is propagated to the output of the combinational logic on the basis of propagation of the received data through at least one of logic gates of the receiver clock domain to combinational logic so as to determine any fluctuation of data that is to be inputted to the combinational logic.

12 Claims, 32 Drawing Sheets

FIG. 7A

```
module JitterDetector(
         input T,
         output reg E);
    parameter PERIOD = 1;
    always @(T) begin
         E <= 1;
         #PERIOD;
         E <= 0;
    end
endmodule
```

FIG. 7B

```
module JitterDetector(
        input T,
        output reg E,
        input reg RX_CLK);
    always @(T) begin
        E <= 1;
        @(posedge RX_CLK);
        E <= 0;
    end
endmodule
```
/702

FIG. 10

| NAME | CLOCK NAME | INPUT NAME | OUTPUT NAME |
|---|---|---|---|
| FF1 | CLK1 | N1 | T1 |
| FF2 | CLK1 | N2 | T2 |
| FF3 | CLK1 | N3 | T3 |
| FF4 | CLK2 | T1 | R4 |
| FF5 | CLK2 | G | R5 |
| FF6 | CLK2 | R4 | R6 |
| FF7 | CLK2 | R5 | R7 |
| FF8 | CLK2 | Q1 | R8 |
| FF9 | CLK2 | M9 | R9 |
| FF10 | CLK2 | Q2 | R10 |
| ⋮ | ⋮ | ⋮ | ⋮ |

| OUTPUT NAME | LOGIC EQUATION |
|---|---|
| Q1 | R6 & R7 |
| Q2 | R8 \| R9 |
| G | T2 & T3 |
| ⋮ | ⋮ |

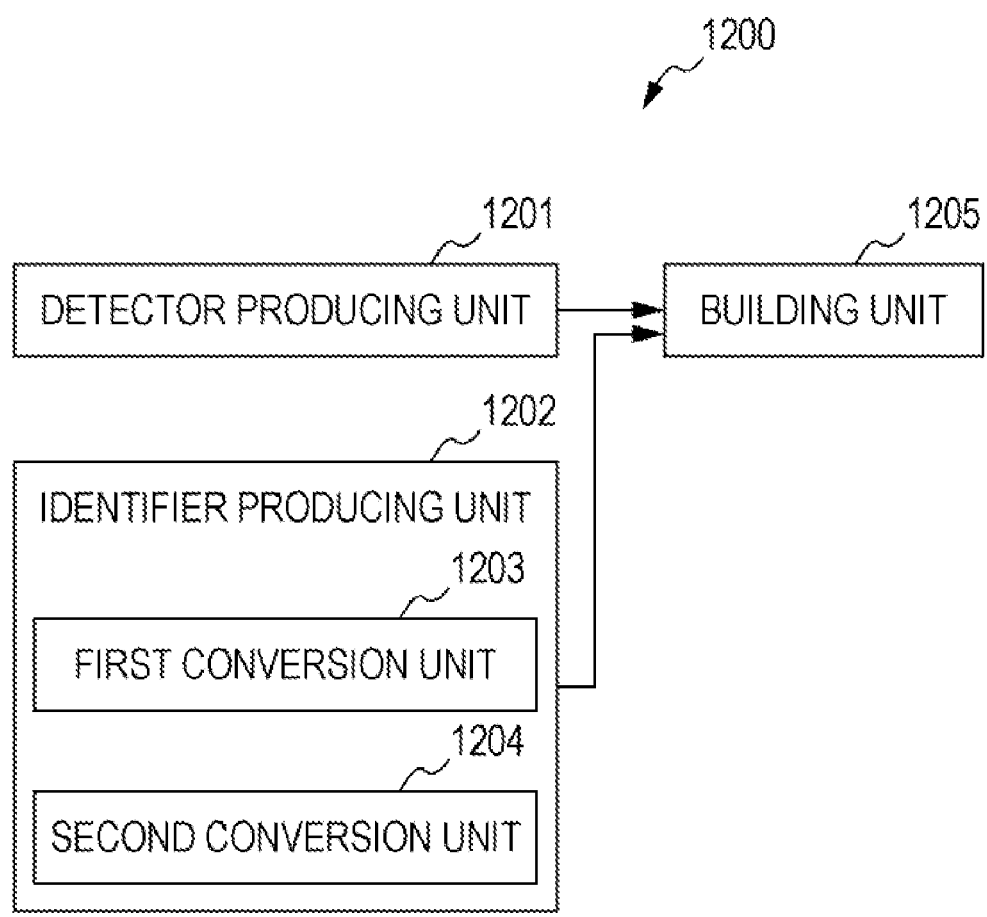

VERIFICATION SUPPORT SYSTEM AND METHOD

CROSS-REFERENCE TO RELATED APPLICATIONS

This application is based upon and claims the benefit of priority of the prior Japanese Patent Application No. 2009-19651, filed on Jan. 30, 2009, the entire contents of which are incorporated herein by reference.

FIELD

The embodiments discussed herein are related to a verification support system which supports logic verification of a semiconductor integrated circuit including a plurality of clock domains.

BACKGROUND

Ordinarily, data is transferred from a flip-flop (hereinafter called "FF") in one clock domain (hereinafter called the transmitter clock domain) and is input to an FF in a different clock domain (hereinafter called the receiver clock domain) in some cases.

In some cases where the FF in the receiver clock domain receives the data, since the data is provided regardless of the clock timing of the FF in the receiver clock domain, setup time or hold time violation and a resultant metastable condition may occur at the output of the FF. In some cases, an effect of the metastable condition is propagated as a difference in logic values to a subsequent FF or combinational logic, and causes an erroneous operation of the semiconductor integrated circuit. Thus, it may verify that the semiconductor integrated circuit is free from an erroneous operation even if a metastable condition occurs.

Logic verification using an ordinary FF model, however, does not take an effect of a metastable condition into account. Thus, there is a known technology for changing a model of a receiver FF that is provided with data transferred from the transmitter clock domain to the receiver clock domain to a model configured to simulate an effect of a metastable condition for performing verification.

Since an effect of the metastable condition is included in a result of the verification performed after the change of the model, it is difficult to analyze a failure factor. Thus, logic verification is usually performed before the change of the model for checking that an ordinary function is free from a problem. Then, a same input pattern is used for logic verification after the change of the model for examining whether the effect of the metastable condition causes no problem. On that occasion, it is important whether or not the input pattern is usable for testing the problem caused by the effect of the metastable condition.

In order to closely estimate whether or not the input pattern is usable enough for testing the problem caused by the effect of the metastable condition, however, it may trace every operation condition in the semiconductor integrated circuit until a change (fluctuation) of the data transferred between the clock domains is propagated to an output terminal of the semiconductor integrated circuit, which may not be dealt with in a practical amount of computation. Thus, a trade-off between accuracy of estimation sufficiency of the input pattern and its computation cost remains a problem to be solved.

If the output terminal of the semiconductor integrated circuit alone is observed, it is unclear a change of data transferred between which clock domains is propagated. Hence, it is made unclear whether or not the input pattern is usable for verifying the metastable condition, and thus there is a problem in that missed verification occurs.

Thus, in lots of cases, a change in data input from the transmitter clock domain to the receiver clock domain alone is observed, and it is identified whether or not the input pattern is usable for testing the problem caused by the effect of the metastable condition. In general, the data transferred from the transmitter clock domain to the receiver clock domain may not be referred to every cycle in the receiver clock domain. At an output of a combinational logic, in some cases where the combinational logic is provided with a plurality of inputs, propagation of an effect of a metastable condition is cut off with an input other than an input to which the effect of the metastable condition is propagated. If only the change in the input data is observed, such a case is not considered and thus there is a problem in that missed verification tends to occur.

Further, according to a technology for performing verification by changing a model of a receiver FF to an FF model that simulates an effect of a metastable condition, a designer (or one who verifies) observes output data of the changed model of the receiver FF, checks how many times the metastable condition occurs and estimates sufficiency of the input pattern. Also in this case, however, a metastable condition that has occurred is referred to, and whether or not the effect is transferred to the later stage is not considered at all. Thus, similarly, there is a problem in that missed verification tends to occur.

SUMMARY

According to an aspect of the embodiment, a verification support system for supporting logic verification of a circuit including a transmitter clock domain and a receiver clock domain, the transmitter clock domain including a plurality of logic gates driven by a transmitter clock and a plurality of outputs for transmitting data, the receiver clock domain including a plurality of logic gates driven by a receiver clock, a plurality of inputs coupled to the outputs of the transmitter domain for receiving transmitted data, and a combinational logic coupled to at least one of the logic gates of the receiver domain, the system includes a detector for receiving data to be transmitted from the transmitter clock domain, and for detecting a fluctuation of the received data due to any timing fluctuation responsive to the transmitter clock, and an identification unit for identifying whether or not any fluctuation of the data determined by the detector is propagated to the output of the combinational logic on the basis of propagation of the received data through at least one of the logic gates of the receiver clock domain to the combinational logic so as to determine any fluctuation of data that is to be inputted to the combinational logic.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7A illustrates an example of a model of a 1-1 Jitter Detector (first one).

FIG. 7B illustrates an example of a model of a 1-1 Jitter Detector (second one).

FIG. 10 illustrates an example of DUT data.

FIG. 12 is a functional block diagram of a verification support system of a second embodiment.

DESCRIPTION OF EMBODIMENTS

Preferred embodiments of the present technique will be explained with reference to accompanying drawings. According to the embodiments, it is identified whether or not an input pattern is usable for verifying whether or not an effect of a metastable condition is propagated to an output of a combinational logic in a receiver clock domain, and an input pattern that is made is used for comparing a verified result after a change of a model and a verified result before the change of the model.

As to first and third embodiments, a verification support program for identifying whether or not data transferred from a transmitter clock domain to a receiver clock domain by means of a Jitter propagation possibility detector is propagated to an output of a combinational logic in the receiver clock domain will be explained.

Next, as to a second embodiment, a verification support program for automatically producing the Jitter propagation possibility detector according to the first embodiment will be explained. Then, as to a fourth embodiment, a verification support program for automatically producing the Jitter propagation possibility detector used for the third embodiment will be explained.

Next, as to a fifth embodiment, a Jitter propagation detector is used for comparing a verified result after a change of a model and a verified result before the change of the model. Then, as to a sixth embodiment, a verification support program for automatically producing the Jitter propagation detector according to the fifth embodiment will be explained.

First, the first embodiment will be explained. According to the first embodiment, a Jitter propagation possibility detector is used for detecting a change of input data provided to a receiver clock domain. Then, it is identified whether or not the change of the input data is propagated to an output of a combinational logic on the basis of a verified result and an input to the combinational logic in the receiver clock domain. The Jitter propagation possibility detector is a detector configured to detect whether or not a change of data is propagated to the output of the combinational logic.

Figure 1:
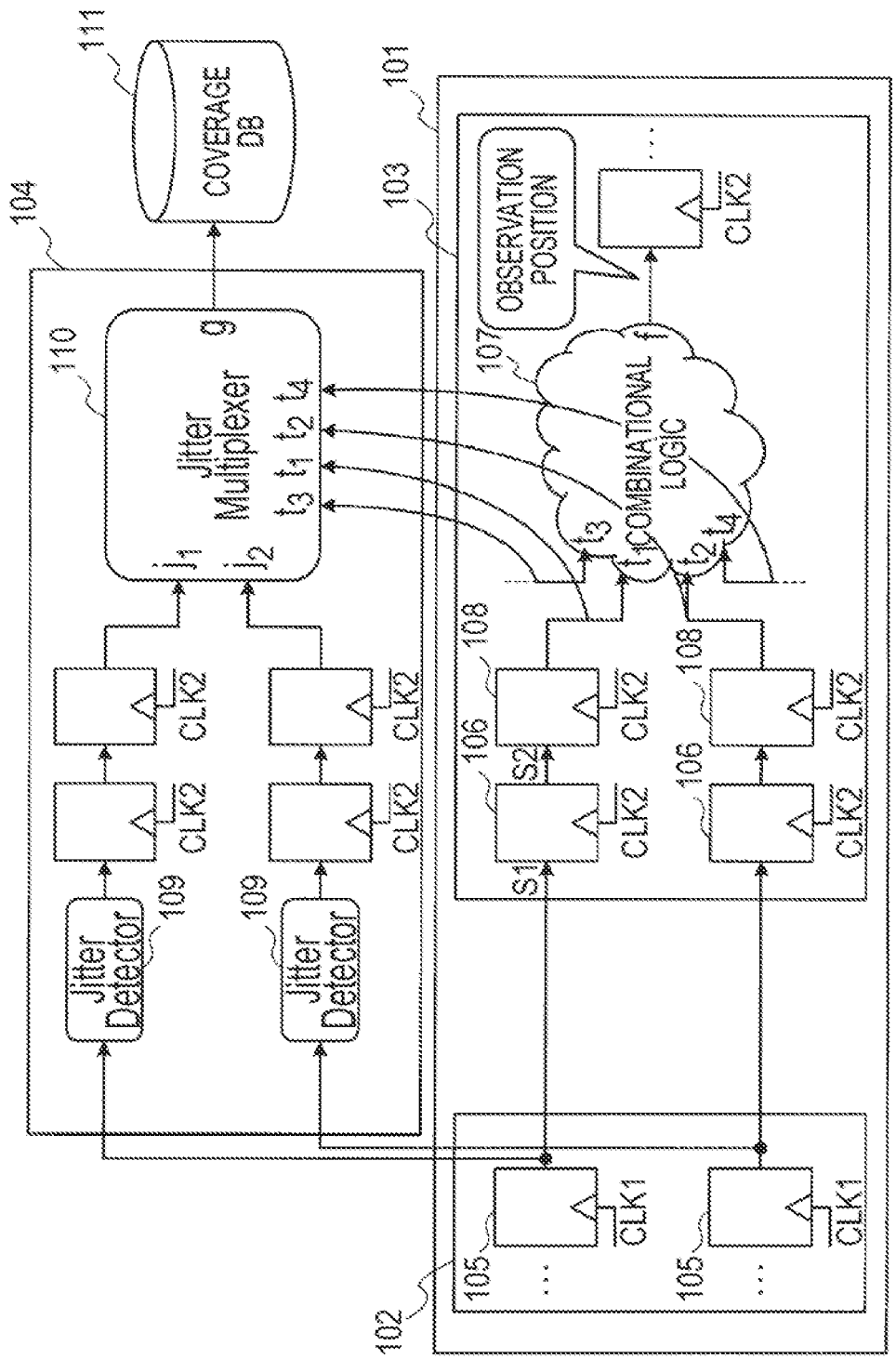
FIG. 1 illustrates a Jitter propagation possibility detector according to a first embodiment of the present technique.

FIG. 1 illustrates the Jitter propagation possibility detector according to the first embodiment. In circuit data 101 including a plurality of clock domains, output data of a transmitter FF 105 in a transmitter clock domain 102 is provided to a receiver FF 106 in a receiver clock domain 103. The transmitter FF 105 in the transmitter clock domain 102 is synchronized with a transmitter clock (CLK1). Then, the receiver FF 106 and an FF 108 in the receiver clock domain 103 are synchronized with a receiver clock (CLK2). Output data of the receiver FF 106 provided with S1 is S2, and output data of the FF 108 provided with S2 is t1. A metastable condition that occurs in the receiver clock domain will be explained with reference to FIG. 2. The pair of FFs 108 are coupled to the combinational logic.

Figure 2:
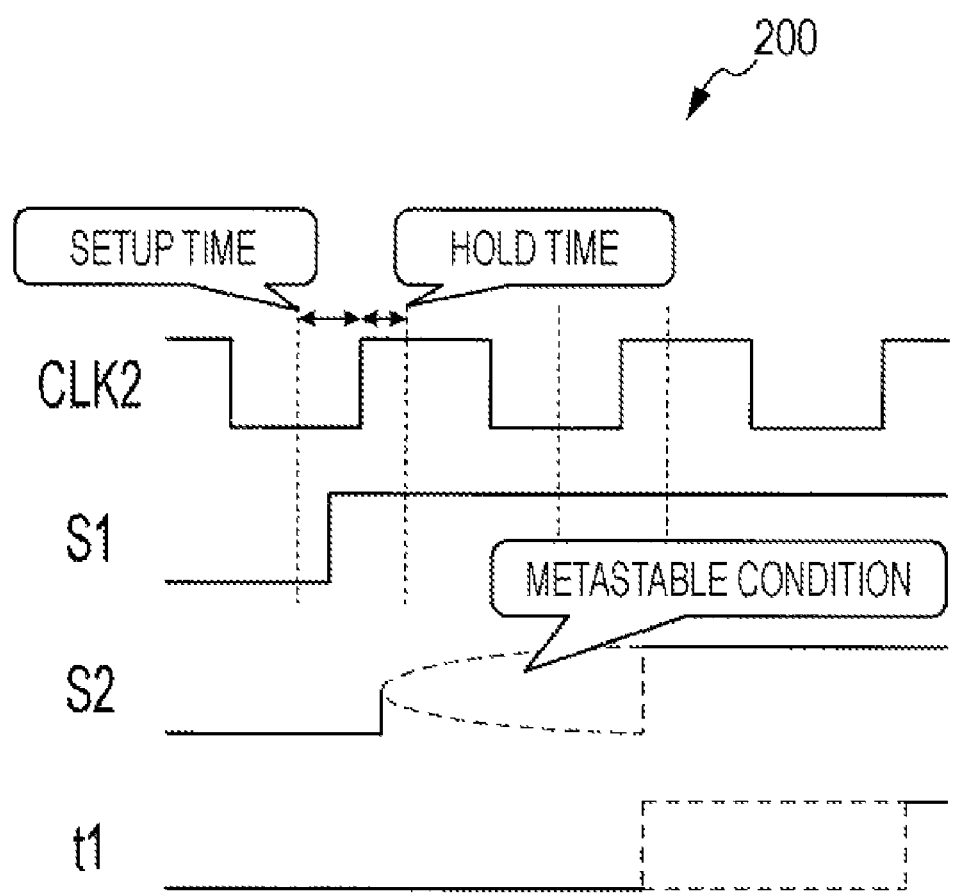
FIG. 2 illustrates an example of a metastable condition.

FIG. 2 illustrates an example of the metastable condition. A timing chart 200 illustrates a case where S1 changes at a rise of CLK2 without observing setup time and hold time. The output of the receiver FF 106, S2, remains in a metastable condition until data of S1 is taken in at a next rise of CLK2. The metastable condition is an unstable condition which may be possibly identified as a logical value 0 as well as a logical value 1. Thus, an unpredictable logical value (0 or 1) appears at the output of the FF 108 that has taken in the metastable condition, t1.

As illustrated in FIG. 1, as before, a Jitter propagation possibility detector 104 identifies whether or not an effect of the metastable condition caused by a provided input pattern is propagated to an output of a combinational logic 107 in the receiver clock domain 103. The Jitter propagation possibility detector 104 is a model for verification. The Jitter propagation possibility detector 104 is constituted by a Jitter Detector 109, a Jitter Multiplexer 110 and FFs of the same number of stages as the receiver clock domain 103. The Jitter Detector 109 is a detector configured to detect a change (fluctuation) of data. Then, the Jitter Multiplexer 110 is an identifier configured to identify whether or not the change of data is propagated to the output of the combinational logic in accordance with input data to the combinational logic.

The Jitter Detector 109 detects a change of an output of the transmitter FF 105. Then, the Jitter Multiplexer 110 identifies whether or not the change of the output data of the transmitter FF 105 is propagated to an output of a combinational logic 107. Then, e.g., the Jitter Multiplexer 110 provides a coverage DB 111 stored in a memory device with an identified result. Next, FIG. 3 illustrates an example of a verification object circuit.

(An Example of a Verification Object Circuit 300)

Figure 3:
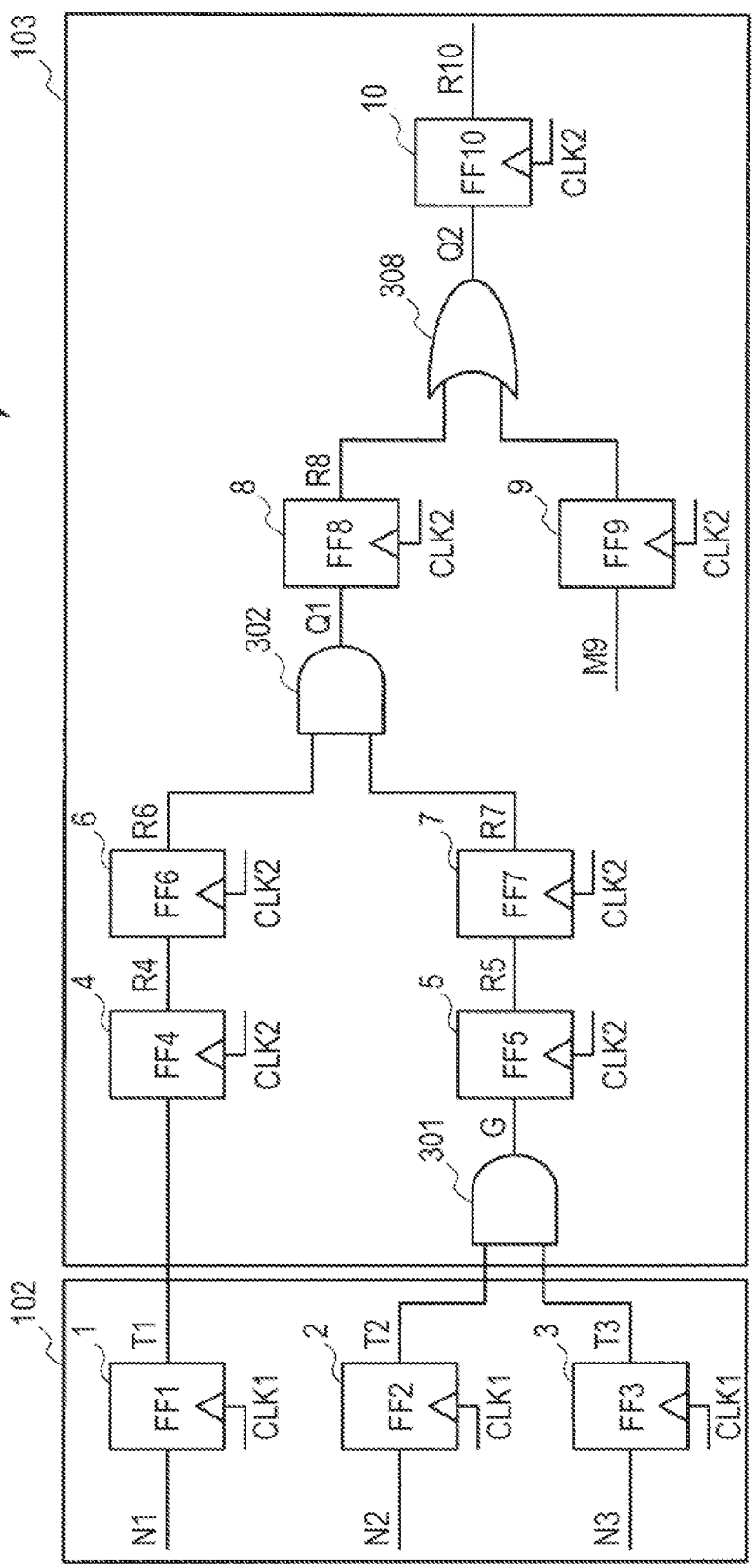
FIG. 3 illustrates an example of a verification object circuit including a plurality of clock domains.

FIG. 3 illustrates an example of a verification object circuit 300 including a plurality of clock domains. The verification object circuit 300 is constituted by including a transmitter clock domain 102 and a receiver clock domain 103. The transmitter clock domain 102 and the receiver clock domain 103 include FFs 1-3 and FFs 4-10, respectively. Although practically being an RTL (Register Transfer Level) description or a net list, the verification object circuit 300 is illustrated by a circuit diagram for easy comprehension. An output T1 of the FF1 in the transmitter clock domain 102 is an input to the FF4 in the receiver clock domain 103. Outputs T2 and T3 of the FF2 and the FF3 in the transmitter clock domain 102, respectively, are inputs to a combinational logic 301. Then, an output G of the combinational logic 301 is an input to the FF5 in the receiver clock domain 103.

Figure 4:
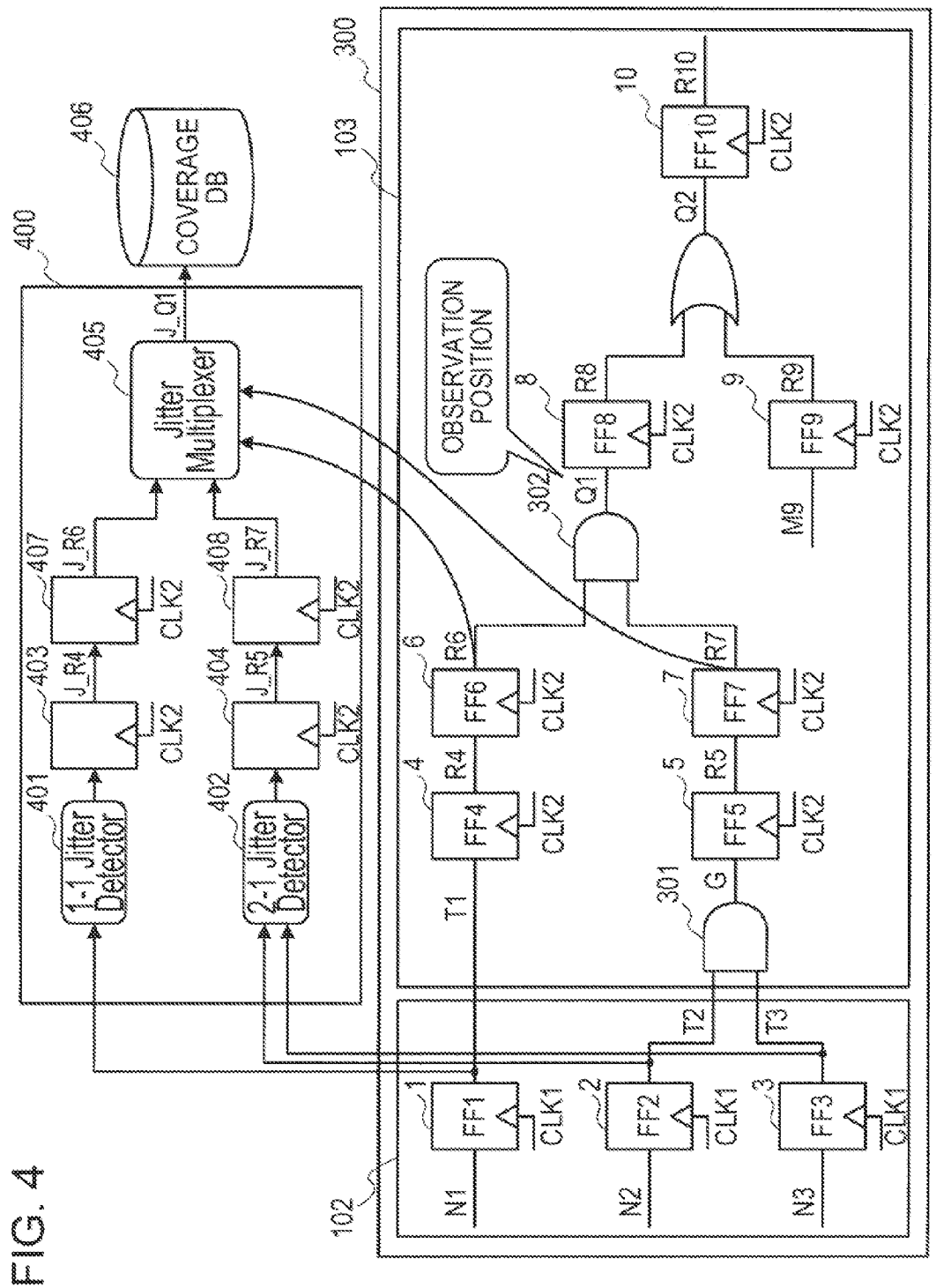
FIG. 4 illustrates the Jitter propagation possibility detector including an observation position at Q1.

According to the first embodiment, e.g., it is identified whether or not changes of the data T1, T2 and T3 are propagated to an output Q1 of a combinational logic 302 in the receiver clock domain 103. FIG. 4 illustrates the Jitter propagation possibility detector including an observation position of Q1.

FIG. 4 illustrates the Jitter propagation possibility detector including the observation position of Q1. A Jitter propagation possibility detector 400 is constituted by including a 1-1 Jitter Detector 401, a 2-1 Jitter Detector 402, an FF 403, an FF 404, an FF 407, an FF 408 and a Jitter Multiplexer 405.

The prefix "x-1" of the "Jitter Detector" given here indicates that the number x of transmitter FFs provide one receiver FF with inputs. Thus, the 1-1 Jitter Detector 401 indicates that one transmitter FF in the transmitter clock domain 102 provides one receiver FF in the receiver clock domain 103 with an input. Similarly, the 2-1 Jitter Detector 402 indicates that two transmitter FFs in the transmitter clock domain 102 provide one receiver FF in the receiver clock domain 103 with inputs.

The 1-1 Jitter Detector 401 detects a change of input data to the FF4. Then, the 2-1 Jitter Detector 402 detects a change of input data to the FF5. The FFs 403, 404, 407 and 408 are FFs for being synchronized with the verification object circuit 300. The Jitter Multiplexer 405 identifies whether or not the changes of T1 and G are propagated to Q1 in accordance with the input data to the combinational logic 302. Then, an identified result is provided to a coverage DB 406 stored in the memory device.

(A Hardware Configuration of a Verification Support System)

Figure 5:
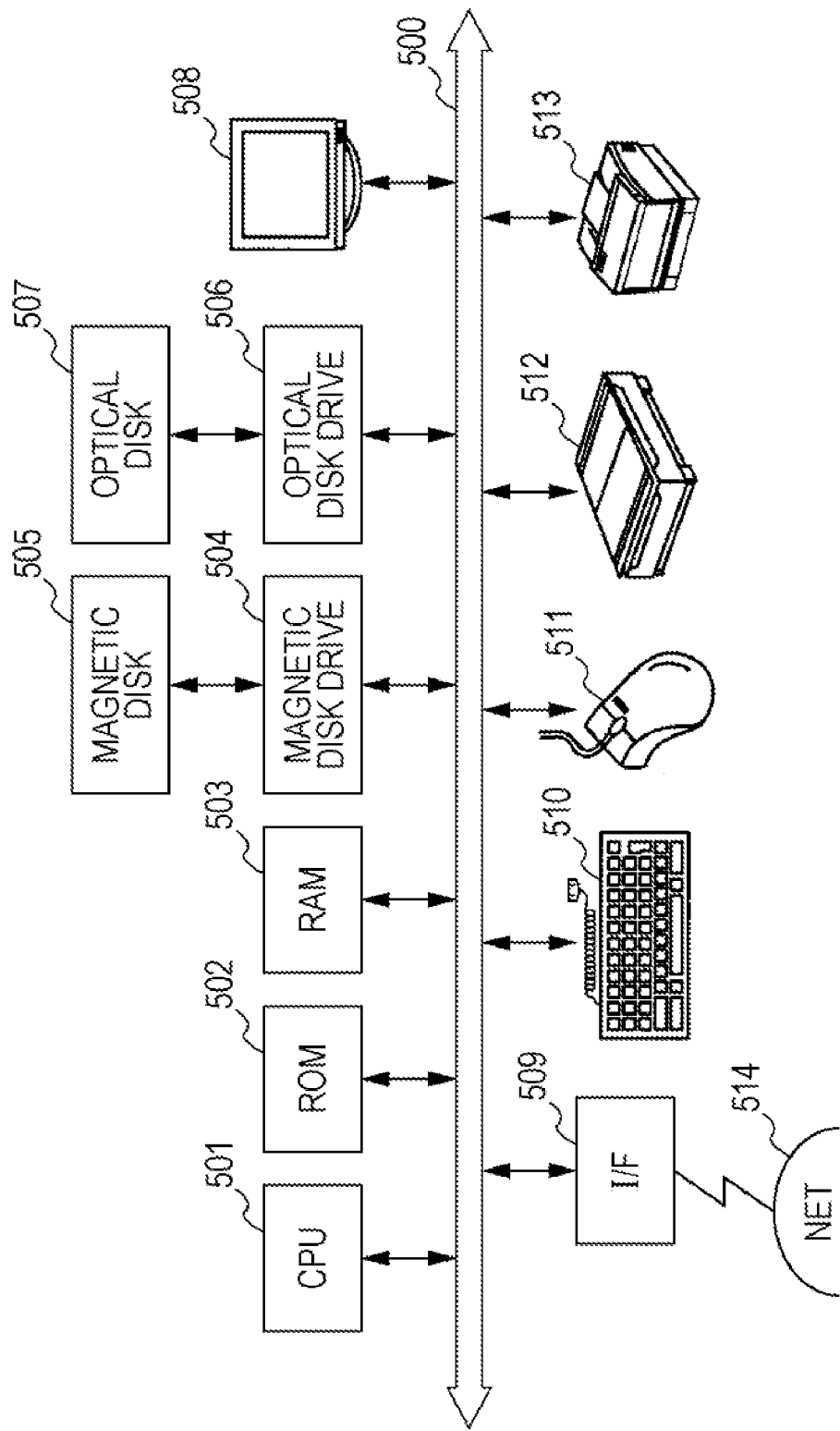
FIG. 5 is a block diagram illustrating a hardware configuration of a verification support system of the embodiment.

FIG. 5 is a block diagram illustrating a hardware configuration of a verification support system of the embodiment. As illustrated in FIG. 5, the verification support system includes a CPU (Central Processing Unit) 501, a ROM (Read-Only Memory) 502, a RAM (Random Access Memory) 503, a magnetic disk drive 504, a magnetic disk 505, an optical disk drive 506, an optical disk 507, a display 508, an I/F (interface) 509, a keyboard 510, a mouse 511, a scanner 512 and a printer 513. Further, the above portions are connected to one another through a bus 500.

The CPU 501 illustrated here controls the entire verification support system. A program such as a boot program is stored in the ROM 502. The RAM 503 is used as a work area for the CPU 501. The magnetic disk drive 504 controls a read/write operation of data from/to the magnetic disk 505 as controlled by the CPU 501. Data written in as controlled by the magnetic disk drive 504 is stored in the magnetic disk 505.

The optical disk drive 506 controls a read/write operation of data from/to the optical disk 507 as controlled by the CPU 501. Data written in as controlled by the optical disk drive 506 is stored in the optical disk 507, and data stored in the optical disk 507 may be read by a computer.

The display 508 displays data such as a document, an image, functional data as well as a cursor, an icon and a toolbox. As the display 508, e.g., a CRT, a TFT liquid crystal display, a plasma display and so on may be adopted.

The interface (shortened as "I/F" hereafter) 509 is connected to a network 514 such as a LAN (Local Area Network), a WAN (Wide Area Network) or the Internet through a communication circuit, and is connected to another device through the network 514. Then, the I/F 509 controls the interface between the network 514 and the inside, and controls data input/output from/to an external device. As the I/F 509, e.g., a modem, a LAN adaptor and so on may be adopted.

The keyboard 510 includes keys for entering characters, numerals, various kinds of instructions and so on, and is used for entering data. The keyboard 510 may also be a touch panel type input pad, numeric keys and so on. The mouse 511 is used for moving the cursor, selecting an area, or moving or resizing a window. Something having a similar function of a pointing device such as a track ball or a joy stick will do.

The scanner 512 optically reads an image and takes image data in the verification support system. Incidentally, the scanner 512 may include an OCR (Optical Character Reader) function. Further, the printer 513 prints image data or document data. As the printer 513, e.g., a laser printer, an inkjet printer and so on may be adopted.

(A Functional Structure of the Verification Support System)

Figure 6:
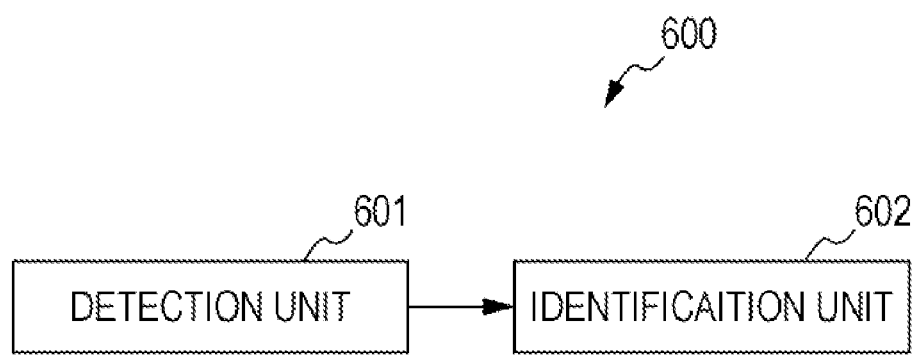
FIG. 6 is a functional block diagram of the verification support system of the first embodiment.

Next, a functional structure of the verification support system will be explained. FIG. 6 is a functional block diagram of the verification support system of the first embodiment. The verification support system 600 is constituted by including a detection unit 601 and an identification unit 602. To put it concretely, e.g., the detection unit 601 and the identification unit 602 implement their functions by making the CPU 501 run a program stored in the memory device such as the ROM 502, the RAM 503, the magnetic disk 505 or the optical disk 507 illustrated in FIG. 5, or by means of the I/F 509.

The detection unit 601 detects a change of data transferred from the transmitter clock domain 102 to the receiver clock domain 103. To put it concretely, e.g., the 1-1 Jitter Detector 401 in the Jitter propagation possibility detector 104 detects a change of the data T1 provided to the FF4 of the receiver clock domain 103. FIGS. 7A and 7B illustrate examples of models of the 1-1 Jitter Detector 401.

FIG. 7A illustrates an example of a model of the 1-1 Jitter Detector (first one). A model 701 is a model of the Jitter Detector written in a hardware description language. An output E is made 1 if the input T changes, and is made 0 after time of PERIOD passes. Incidentally, the model 701 is stored, e.g., as a library in the memory device such as the RAM 503, the magnetic disk 505 or the optical disk 507.

FIG. 7B illustrates an example of a model of the 1-1 Jitter Detector (second one). A model 702 is a model of the Jitter Detector written in the hardware description language. The output E is made 1 if the input T changes, and is made 0 at a rise of RX_CLK. RX_CLK is made CLK2 in an example of the Jitter propagation possibility detector 104. Incidentally, the model 701 is stored, e.g., as a library in the memory device such as the RAM 503, the magnetic disk 505 or the optical disk 507.

As illustrated in FIG. 6, as before, the identification unit 602 identifies whether or not the change of the data detected by the detection unit 601 is propagated to the output of the combinational logic in the receiver clock domain 103 in accordance with the input data to the combinational logic, and outputs an identified result. To put it concretely, e.g., being provided with a result detected by the detection unit 601 and the input data to the combinational logic 302 in the receiver clock domain 103, the Jitter Multiplexer 405 identifies the above. If, e.g., the identified result is "0" and "1", the Jitter Multiplexer 405 identifies that the change of the data is not propagated and is propagated, respectively. The Jitter Multiplexer 405 is formed by a following logic equation (1).

$$J\_Q1=(R6 \cdot J\_R7)+(J\_R6 \cdot R7)+(J\_R6 \cdot J\_R7) \qquad (1)$$

The logic equation that forms the Jitter Multiplexer 405 is determined by a logical conversion of a logic equation of the combinational logic 302. How to search for the logic equation will be described for a second embodiment later. Next, a verified result of the Jitter propagation possibility detector is illustrated in FIG. 8.

Figure 8:
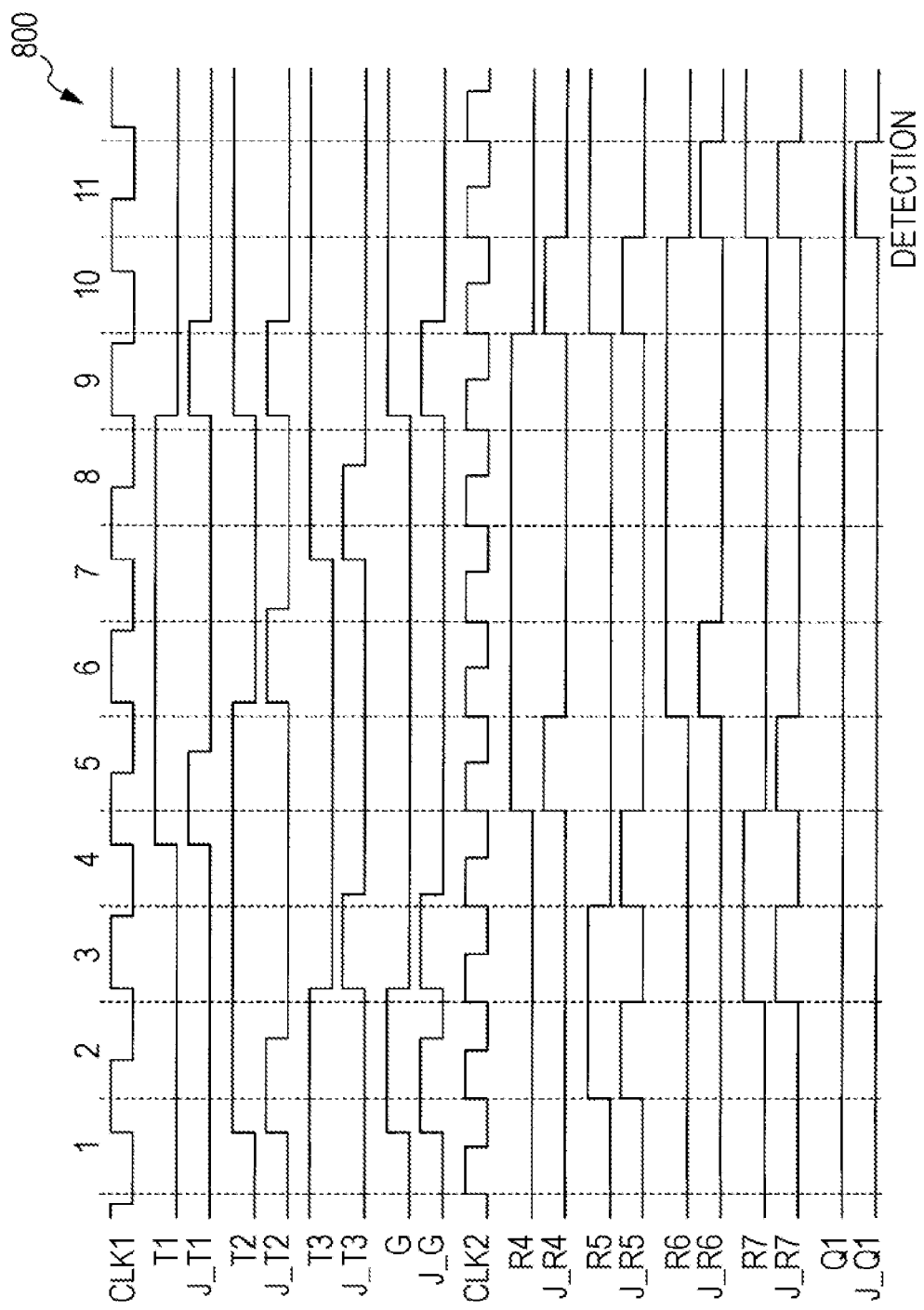
FIG. 8 illustrates an example of a verified result obtained by means of a verification support system.

FIG. 8 illustrates an example of a result verified by the verification support system 600. A timing chart 800 is a timing chart illustrating a result verified by the verification support system 600. Numerals 1-11 indicate the number of clocks of CLK2. At the eleventh clock of CLK2, J_Q1 is made "1". Thus, according to an input pattern for verifying the timing chart 800, an effect of a metastable condition, if occurred, is propagated to the output of the combinational logic 302 at the eleventh clock of CLK2. The designer may thereby easily identify whether or not the input pattern is usable for checking the propagation to the combinational logic.

Further, the identification unit 602 outputs an identified result. To put it concretely, e.g., the identification unit 602 outputs the identified result in relation to the input pattern. An output form may be, e.g., a display on the display 508, a print output to the printer 513 and transmission to an external device through the I/F 509. Further, the identified result may be stored in the memory device such as the RAM 503, the magnetic disk 505 and the optical disk 507.

It may thereby be identified whether or not the provided input pattern is usable for verifying that an effect of a metastable condition that occurs in the receiver clock domain 103 is propagated to the output of the combinational logic. Thus, verification accuracy may be raised.

Incidentally, to put it concretely, e.g., the detection unit 601 and the identification unit 602 described above implement their functions by making the CPU 501 run a program stored in the memory medium such as the ROM 502, the RAM 503 or the magnetic disk 505 illustrated in FIG. 5.

(A Procedure of a Verification Support Process of the System 600)

Figure 9:
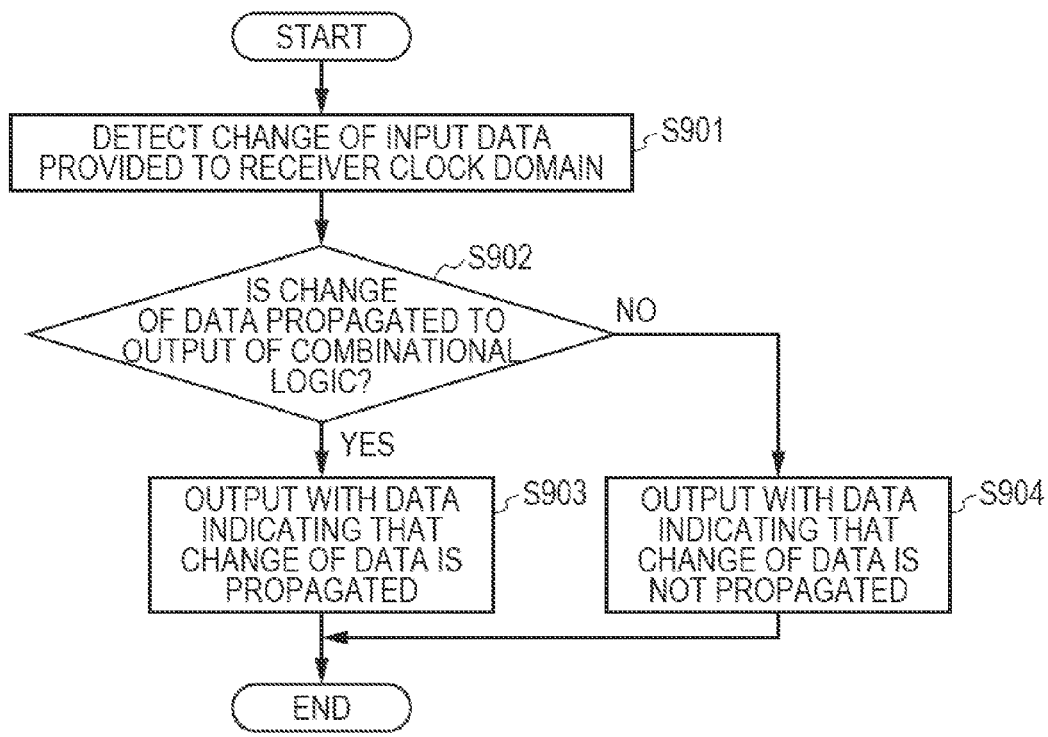
FIG. 9 is a flowchart illustrating a procedure of a verification support process of the verification support system.

A procedure of a verification support process of the verification support system 600 according to the first embodiment will be explained. FIG. 9 is a flowchart illustrating the procedure of the verification support process of the verification support system 600. First, as illustrated in FIG. 9, the detection unit 601 detects a change of input data provided to the receiver clock domain (step S901), and the identification unit 602 identifies whether or not the change of the data is propagated to the output of the combinational logic (step S902). If it is identified that the change of the data is propagated to the output of the combinational logic (step S902: Yes), an output is provided with data indicating that the change of the data is propagated (step S903), and a series of the processes ends. If it is identified that the change of the data is not propagated to the output of the combinational logic (step S902: No), an output is provided with data indicating that the change of the data is not propagated (step S904), and a series of the processes ends.

According to the first embodiment, as described above, it is automatically identified whether the fluctuation of the data transferred to the receiver clock domain 103 is propagated to the output of the combinational logic in the receiver clock domain 103 or cancelled in the combinational logic. Thus, propagation/cancellation of the fluctuation of the data in the combinational logic may be observed at the output position of the combinational logic. As it can thereby be observed without being affected by another combinational logic, verification accuracy may be raised. Further, as another combinational logic is removed from the object of verification, a period of time for verification may be reduced for that. Moreover, an input pattern that is usable for testing an effect of a metastable condition even if the combinational logic in the receiver clock domain 103 is complicated may be made.

Then, the second embodiment will be explained. According to the second embodiment, the Jitter propagation possibility detector of the first embodiment is automatically produced. A period of time for verification may thereby be reduced. Incidentally, each of portions which are same as the corresponding ones explained as to the first embodiment is given a same reference numeral, and its explanation is omitted.

(DUT (Device Under Test) Data)

FIG. 10 illustrates an example of DUT data. DUT data 1000 holds an FF list 1001 and a combinatorial logic list 1002. The FF list 1001 holds data of an FF name, a clock name, an input name and an output name. The combinatorial logic list 1002 holds an output name of a combinational logic and a logic equation of the combinational logic. The data in the DUT data 1000 exemplifies the verification object circuit 300 described above. Incidentally, the DUT data 1000 is stored in the memory device such as the RAM 503, the magnetic disk 505 or the optical disk 507. Next, FIG. 11 illustrates a CDC list.

(CDC (Clock Domain Crossing) List)

Figure 11:
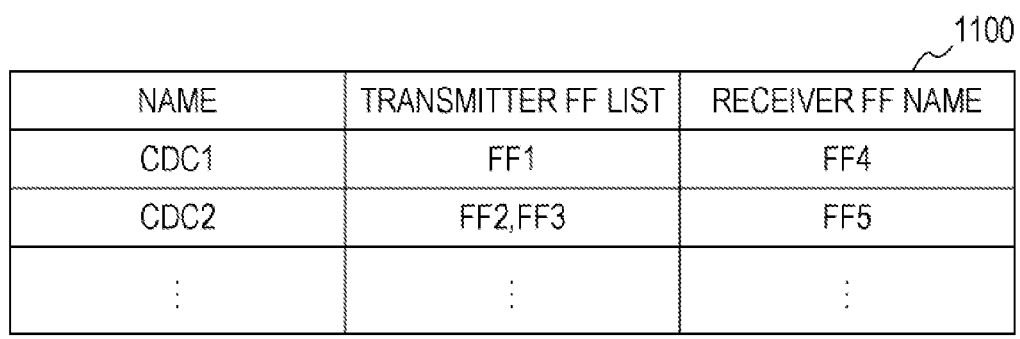
FIG. 11 illustrates an example of a CDC list.

FIG. 11 illustrates an example of a CDC list. A CDC list 1100 holds a CDC name, a transmitter FF list and a receiver FF name. A CDC1, e.g., indicates that an FF1 provides an FF4 with an output. A CDC2, e.g., indicates that outputs of an FF2 and an FF3 enter into an input of the combinational logic and are provided to an FF5. The data in the CDC list 1100 exemplifies the verification object circuit 300 described above. Incidentally, the CDC list 1100 is stored in the memory device such as the RAM 503, the magnetic disk 505 or the optical disk 507.

(A Functional Structure of a Verification Support System)

Next, a functional structure of a verification support system will be explained. FIG. 12 is a functional block diagram of a verification support system of the second embodiment. The verification support system 1200 is constituted by including a detector producing unit 1201, an identifier producing unit 1202 and a building unit 1205. To put it concretely, the detector producing unit 1201, the identifier producing unit 1202 and the building unit 1205 implement their functions by making the CPU 501 run a program stored in the memory device such as the ROM 502, the RAM 503, the magnetic disk 505 or the optical disk 507 illustrated in FIG. 5, or by means of the I/F 509.

The detector producing unit 1201 produces, for every transmitter FF, a Jitter Detector configured to detect a fluctuation of data transferred from a transmitter FF in the transmitter clock domain 102 of the verification object circuit 300 to a receiver FF in the receiver clock domain 103 and provided to a combinational logic in the receiver clock domain 103. To put it concretely, e.g., the CPU 501 accesses the memory device, reads the model 701 (or the model 702) of the 1-1 Jitter Detector, and produces 1-1 Jitter Detectors as many as the transmitter FFs.

If the Jitter propagation possibility detector 400 is taken as an example, a transmitter FF in the transmitter clock domain 102 which transfers data to the FF4 which is a receiver FF in the receiver clock domain 103 is the FF1 alone. The CPU 501 accesses the memory device so as to read the model 701 (or the model 702), and produces one 1-1 Jitter Detector 401. The 2-1 Jitter Detector 402 will be mentioned later.

Then, the identifier producing unit 1202 produces a Jitter Multiplexer formed by a logic equation usable for identifying whether or not a change of data is propagated to the output of the combinational logic in the verification object circuit 300. To put it concretely, the CPU 501 logically converts a logic equation of the combinational logic of the verification object circuit 300 so as to produce the Jitter Multiplexer. The identifier producing unit 1202 produces a Jitter Multiplexer formed by a logic equation obtained by a first conversion unit 1203 and a second conversion unit 1204.

The first conversion unit 1203 converts the logic equation of the combinational logic in the receiver clock domain 103 into a logic equation including a selection circuit configured to select a coefficient that indicates whether or not propagation exists or data provided to the receiver clock domain 103 in accordance with the output data of the Jitter Detector produced by the detector producing unit 1201, and a combinational logic provided with an output of the selection circuit.

To put it concretely, e.g., the CPU 501 accesses the memory device so as to read a logic equation $f(t1, \ldots, tn)$ of the combinational logic from the DUT data 1000. The variables $t1, \ldots, tn$ are inputs to the logic equation. From the DUT data 1000, e.g., a logic equation of the combinational logic 302 in the receiver clock domain 103 is read. The read logic equation is described below.

$$f(R6, R7) = R6 \& R7 \quad (2)$$

Then, the CPU 501 accesses and reads a following logic equation (3) stored in the memory device, and converts variables of the obtained logic equation of the combinational logic into a following logic equation (3) so as to produce a new logic equation f'.

$$f'(t1, \ldots, tn, j1, \ldots, jn, v1, \ldots, vn) = f((j1 \& v1) | (\sim j1 \& t1), \ldots, (j2 \& v2) | (\sim j2 \& t2)) \quad (3)$$

The variable j indicates an output of the Jitter Detector. Further, the variable v is a coefficient that indicates whether or not propagation exists that indicates whether or not data is propagated to the output of the combinational logic if the jitter Detector detects a change of data.

The logic equation (3) is used, e.g., so that the logic equation (2) is converted into a logic equation (4) described below.

$$f'(R6, R7, J\_R6, J\_R7, V\_R6, V\_R7) = f((J\_R6 \& v1) | (\sim J\_R6 \& R6), (J\_R7 \& V\_R6) | (\sim J\_R7 \& V\_R7)) \quad (4)$$

Figure 13A:
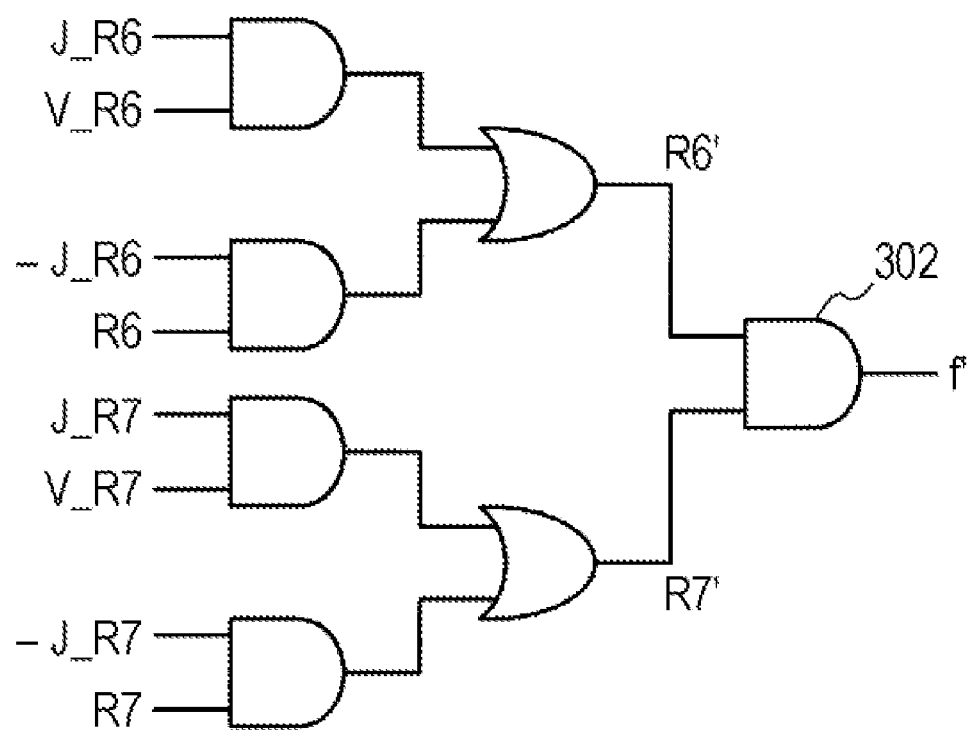
FIG. 13A illustrates a circuit formed by a logic equation (4).

FIG. 13A illustrates a circuit formed by the logic equation (4). An input to the combinational logic 302 is selected on the basis of output data J_R6 and J_R7 of the Jitter Detector. R6' becomes a value of R6 and V_R6 in a case where J_R6 is "0" and "1", respectively. Thus, R6' becomes a value of V_R6 in a case where a change is detected by the 1-1 Jitter Detector 401, and R6' becomes ordinary input data provided to the combinational logic 302 in a case where no change is detected.

R7' becomes a value of R7 and V_R7 in a case where J_R7 is "0" and "1", respectively. Thus, R7' becomes a value of V_R7 in a case where a change is detected by the 1-1 Jitter Detector 402, and R7' becomes ordinary input data provided to the combinational logic 302 in a case where no change is detected.

Next, FIG. 12 is referred to as before. The second conversion unit 1204 converts the logic equation converter by the first conversion unit 1203 into a logic equation that removes a same logic as the combinational logic by giving a particular value to a coefficient that indicates whether or not propagation exists.

To put it concretely, e.g., the CPU 501 accesses and reads a following logic equation (5) stored in the memory device, and converts f' produced by using the logic equation (3) by means of the logic equation (5) so as to produce a logic equation g of the Jitter Multiplexer.

$$g(t1, \ldots, tn, j1, \ldots, jn) = \exists (v1, \ldots, vn) \cdot [f'(t1, \ldots, tn, j1, \ldots, jn, v1, \ldots, vn) \neq f(t1, \ldots, tn)] \quad (5)$$

A state in which "0" is input from the logic equation (3) to the variable v and a state in which "1" is input are connected by a logical sum so as to form a logic equation that removes the same logic as the combinational logic.

The logic equation (5) is used, e.g., so that the logic equation (4) is converted into a logic equation (6) described below.

$$\exists (V\_R6, V\_R7) \cdot \{f'[(J\_R6 \& v1) | (\sim J\_R6 \& R6)] \& [(J\_R7 \& V\_R6) | (\sim J\_R7 \& V\_R7)] \neq (R6 \& J\_R7)\} = (R6 \& J\_R7) | (J\_R6 \& R7) | (J\_R6 \& J\_R7) \quad (6)$$

Figure 13B:
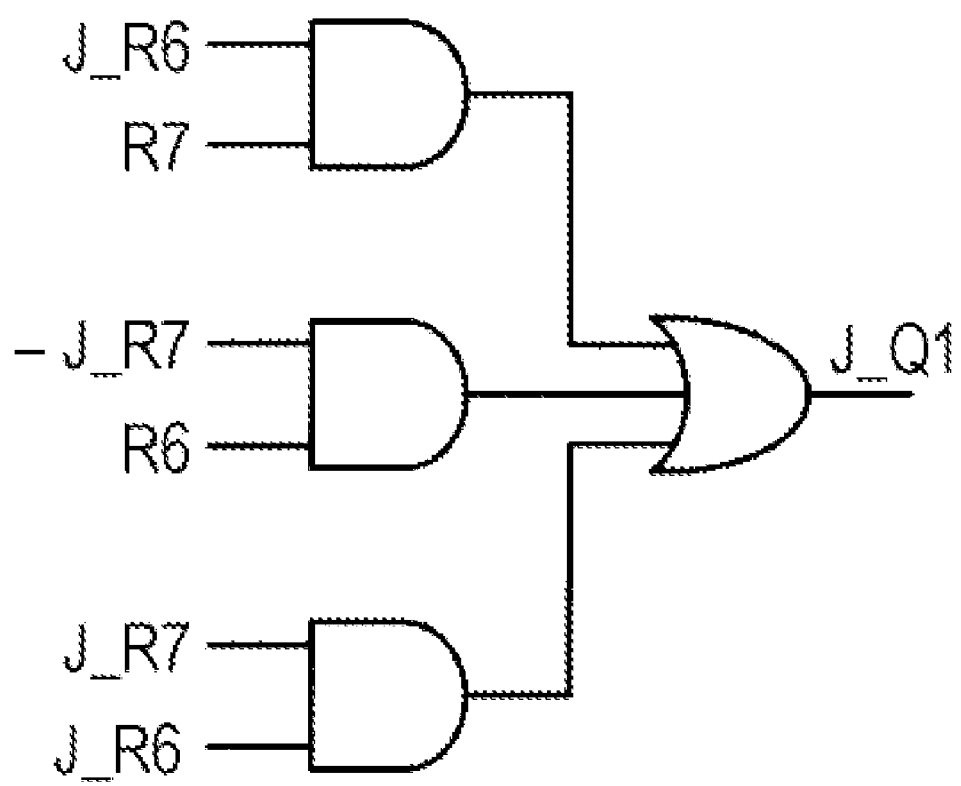
FIG. 13B illustrates a circuit formed by a logic equation (6).

FIG. 13B illustrates a circuit formed by the logic equation (6). In a case where R7 is "1", a change of data detected by the Jitter Detector 401 is propagated to the output of the combinational logic 302. In a case where R6 is "1", a change of data detected by the Jitter Detector 402 is propagated to the output of the combinational logic 302. Further, in a case where data of T1 and G change at the same time, the change of the data is propagated to the output of the combinational logic 302.

Next, FIG. 12 is referred to as before. The building unit 1205 builds a Jitter propagation possibility detector including the Jitter Detector produced by the detector producing unit 1201 and the Jitter Multiplexer produced by the identifier producing unit 1202, and providing the Jitter Multiplexer with the output data of the Jitter Detector and the input data to the combinational logic.

To put it concretely, e.g., the CPU 501 connects the output of the 1-1 Jitter Detector 401 and the input to the FF 403, and connects the output of the FF 403 and the input to the FF 407 next. Then, the output J_R6 of the FF 407 is connected to the input of the Jitter Multiplexer 405. Next, the output of the 1-2 Jitter Detector 402 is connected to the input of the FF 404. Then, the output of the FF 404 is connected to the input to the FF 408. Then, the output J_R7 of the FF 408 is connected to the input to the Jitter Multiplexer 405 so as to build the Jitter propagation possibility detector 400.

Further, the building unit 1205 outputs the Jitter propagation possibility detector built above. To put it concretely, e.g., the building unit 1205 outputs an identified result in relation to the input pattern. An output form may be, e.g., a display on the display 508, a print output to the printer 513 and transmission to an external device through the I/F 509. Further, the identified result may be stored in the memory device such as the RAM 503, the magnetic disk 505 or the optical disk 507.

Figure 14:
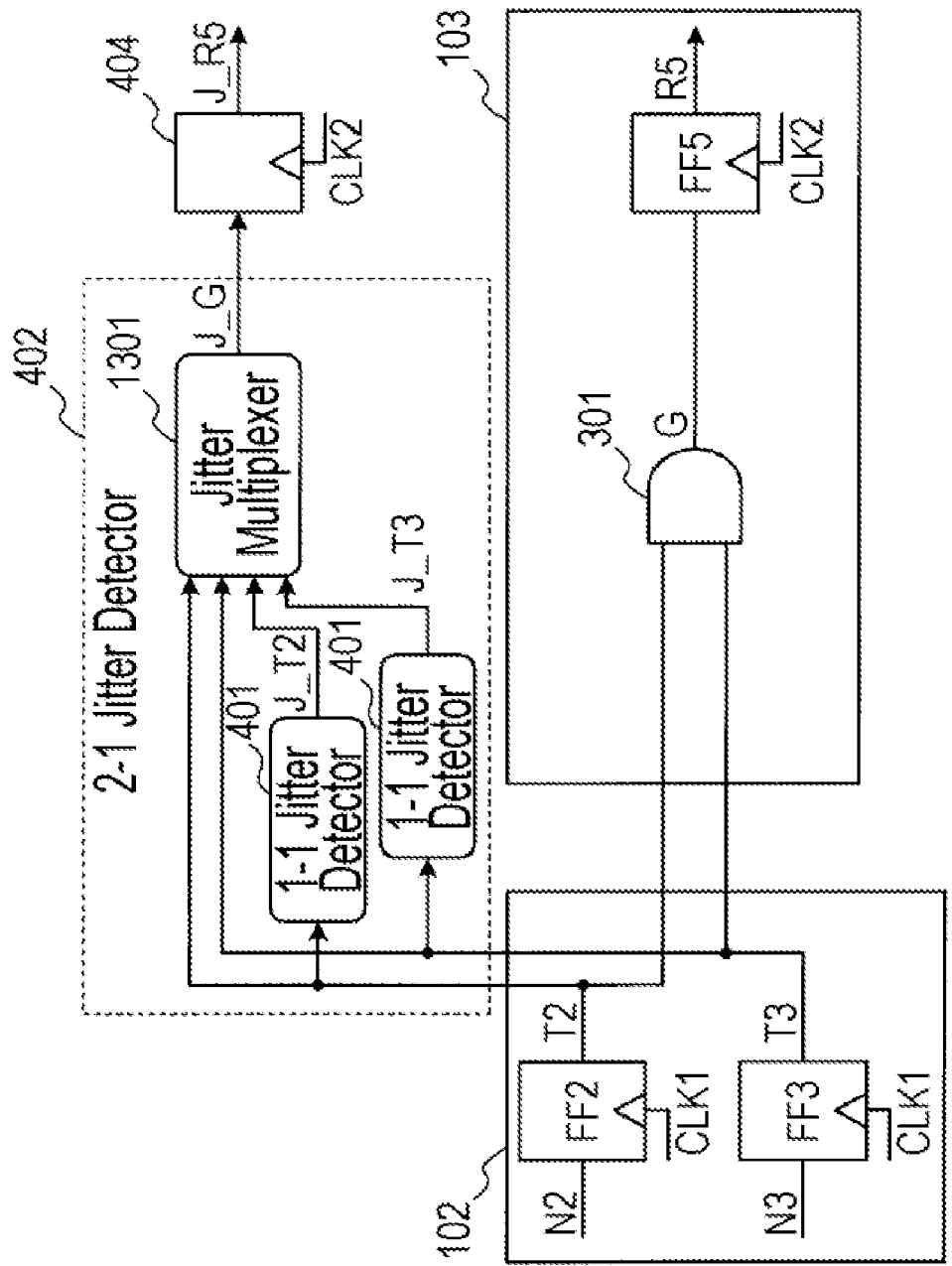
FIG. 14 illustrates a 2-1 Jitter Detector.

Further, in a case where the output data of the transmitter clock domain 102 is provided to an FF in the receiver clock domain 103 through a combinational logic, the detector producing unit 1201, the identifier producing unit 1202 and the building unit 1205 are used for producing the Jitter Detector. FIG. 14 illustrates the Jitter Detector in a case where the output data of the transmitter clock domain 102 is provided to an FF in the receiver clock domain 103 through a combinational logic.

FIG. 14 illustrates the 2-1 Jitter Detector 402. Output data of the FF2 and the FF3 in the transmitter clock domain 102 is provided to the FF5 through the combinational logic 301. The 2-1 Jitter Detector 402 is constituted by a 1-1 Jitter Detector 401 configured to detect a change of the output data of the FF2, a 1-1 Jitter Detector 401 configured to detect a change of the output data of the FF3 and a Jitter Multiplexer 1301.

The Jitter Multiplexer 1301 identifies whether or not changes of the output data of the FF2 and the FF3 detected by the 1-1 Jitter Detectors 401 are propagated to the output of the combinational logic 301 in accordance with input data to a combinational logic 306. The Jitter Multiplexer 1301 is formed by a following logic equation (7).

$$J\_G = (T2 \& J\_T3) | (J\_T2 \& T3) | (J\_T2 \& J\_T3) \tag{7}$$

FIG. 12 is referred to as before. The building unit 1205 builds a Jitter Detector including the Jitter Detector produced by the detector producing unit 1201 and the Jitter Multiplexer produced by the identifier producing unit 1202, and providing the Jitter Multiplexer with the output data of the Jitter Detector and the input data to the combinational logic.

To put it concretely, e.g., the CPU 501 connects the output of the 1-1 Jitter Detector and the input to the Jitter Multiplexer 1301. Then, the data transferred from the transmitter clock domain 102 to the receiver clock domain 103 is connected to the input to the Jitter multiplexer 1301.

The CPU 501, e.g., connects an output J_T2 of the 1-1 Jitter Detector 401 configured to detect a change of T2 and an input to the Jitter Multiplexer 1301. Then, an output J_T3 of the 1-1 Jitter Detector 401 configured to detect a change of T3 is connected to an input to the Jitter Multiplexer 1301 so that the 2-1 Jitter Detector 402 is produced.

Figure 15:
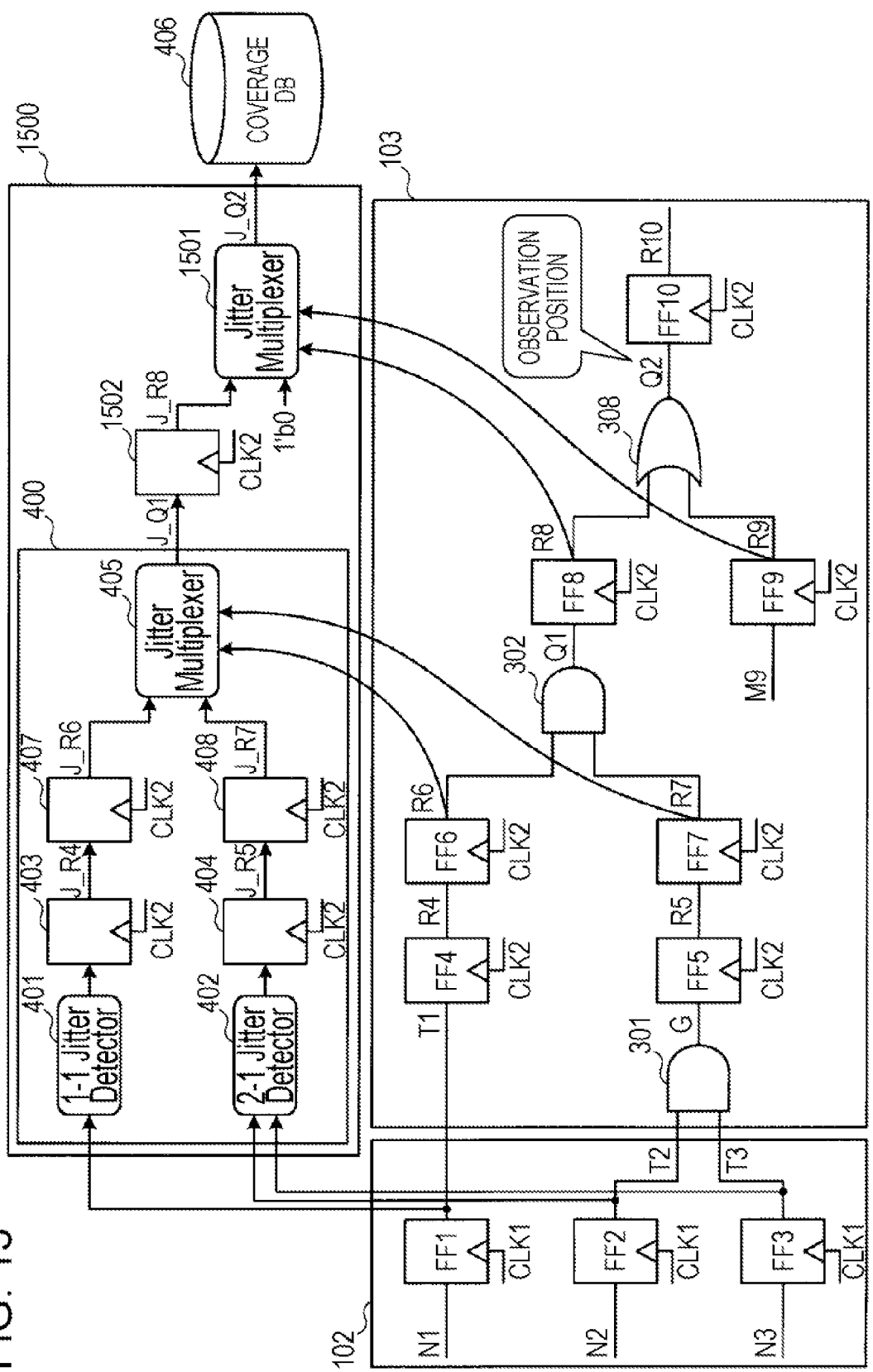
FIG. 15 illustrates the Jitter propagation possibility detector including an observation position at Q2.

Further, a case where an output position of a combinational logic in the receiver clock domain provided with data transferred to the receiver clock domain 103 through another combinational logic in the receiver clock domain becomes an observation position will be explained. A Jitter Multiplexer corresponding to a combinational logic up to the observation position is produced by means of the identifier producing unit 1202 and is built by means of the building unit 1205 so that the Jitter propagation possibility detector may be produced. FIG. 15 illustrates an example for which the observation position is different from that of the Jitter propagation possibility detector 400.

FIG. 15 illustrates the Jitter propagation possibility detector including an observation position at Q2. A Jitter propagation possibility detector 1500 is constituted by a Jitter Multiplexer 400, an FF 1502 and a Jitter Multiplexer 1501. The Jitter Multiplexer 1501 is formed by a following logic equation (8).

$$J\_Q2 = J\_R8 \& \sim R9 \tag{8}$$

Thus, the Jitter propagation possibility detector 1500 is built as a consequence of that a Jitter Multiplexer corresponding to all the combinational logics from the receiver FF in the receiver clock domain 103 to the combinational logic caused to be the observation position is produced and the Jitter Multiplexer is connected.

FIG. 12 is referred to as before. The identifier producing unit 1202 produces an identifier corresponding to all the combinational logics from the receiver FF in the receiver clock domain 103 to the observation position.

To put it concretely, e.g., the CPU 501 reads the number of stages of the combinational logic caused to be the observation position stored in the memory device, and produces Jitter Multiplexers as many as the number of stages of the combinational logic by means of the process for producing the Jitter Multiplexer described above. The number of stages of the combinational logic indicates, e.g., where is the combinational logic as counted from the receiver FF in the receiver clock domain 103.

Next, the building unit 1205 includes a Jitter Detector produced by the detector producing unit 1201 and the Jitter Multiplexer produced by the identifier producing unit 1202, and provides the Jitter Multiplexer with the output data of the Jitter Detector and the input data to the combinational logic. Then, the output data of the Jitter Multiplexer is provided to a Jitter Multiplexer corresponding to a combinational logic that takes in the output data of the combinational logic.

To put it concretely, e.g., the CPU 501 connects the output J_Q1 of the Jitter Multiplexer 405 with the input of the FF 1502. Then, the output J_R8 of the FF 1502 is connected with the input to the Jitter Multiplexer 1501 so that the Jitter propagation possibility detector 1500 is built.

Incidentally, to put it concretely, e.g., the detector producing unit 1201, the identifier producing unit 1202, the first conversion unit 1203, the second conversion unit 1204 and the building unit 1205 described above implement their functions by making the CPU 501 run a program recorded on the memory medium such as the ROM 502, the RAM 503 and the magnetic disk 505.

(A Procedure of a Verification Support Process of the System 1200)

Figure 16:
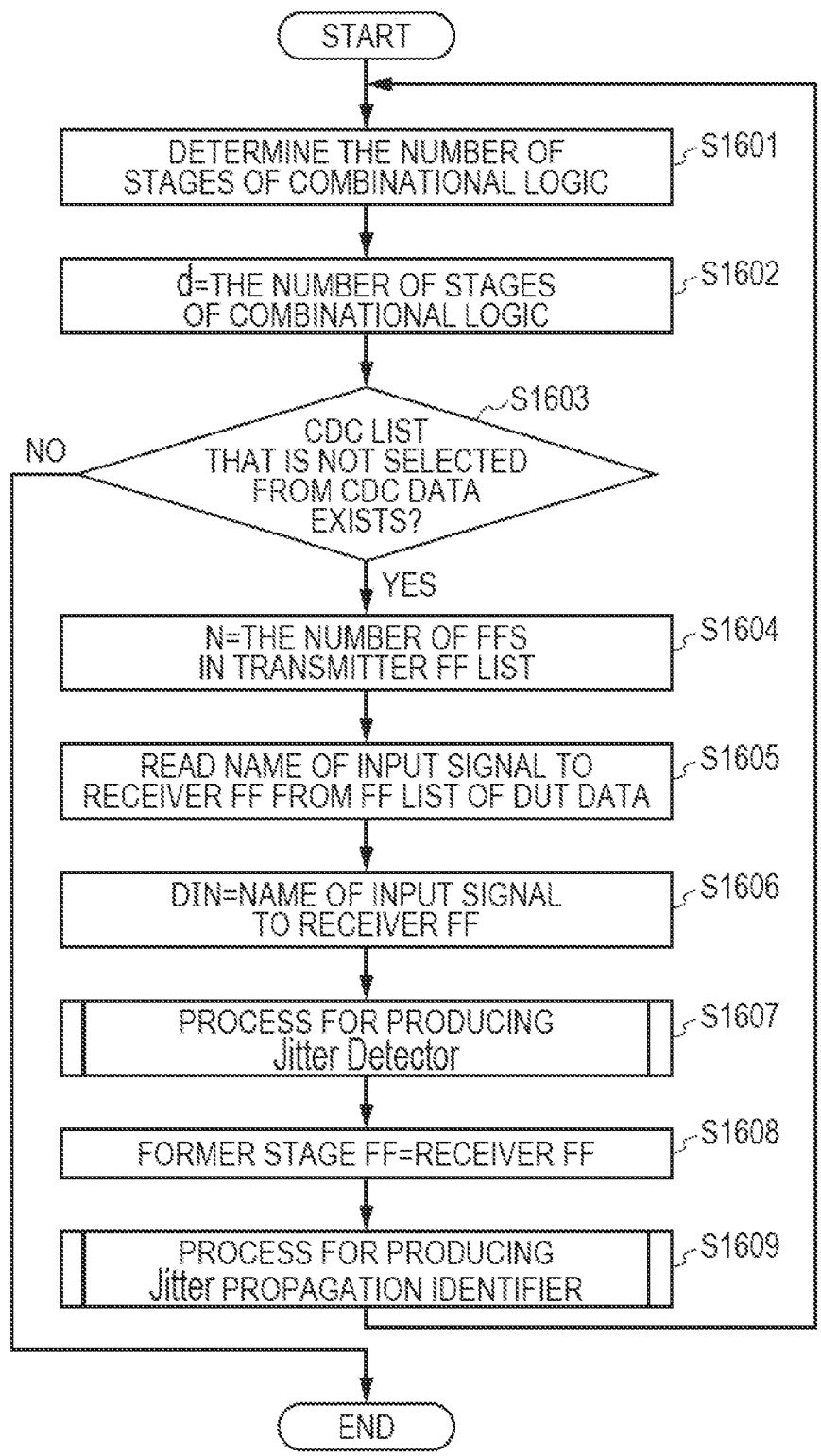
FIG. 16 is a flowchart illustrating a procedure of a verification support process of a verification support system.

A procedure of a verification support process of the verification support system 1200 will be explained. FIG. 16 is a flowchart illustrating a procedure of a verification support process of the verification support system 1200. First, as illustrated in FIG. 16, determine the number of stages of the combinational logic (step S1601). Next, let d=the number of stages of the combinational logic (step S1602), and it is identified whether or not a CDC list not selected from the CDC data exists (step S1603).

If it is identified that a CDC list not selected from the CDC data exists (step S1603: Yes), let N=the number of FFs in the transmitter FF list (step S1604), read a name of an input signal to the receiver FF from the FF list of the DUT data (step S1605), let DIN=the name of the input signal to the receiver FF (step S1606), perform a process for producing the Jitter Detector by means of the detector producing unit 1201 (step S1607), let a former stage FF=the receiver FF (step S1608), perform a process for producing the Jitter propagation identifier by means of the building unit 1205 (step S1609), and return to the step S1601. In the process for producing the Jitter propagation identifier, a Jitter Multiplexer corresponding to the FFs from the receiver FF to the combinational logic, i.e., the observation position, and the respective combinational logics in the receiver clock domain is produced.

Meanwhile, if it is identified that there is no CDC list not selected from the CDC data (step S1603: No), a series of the processes ends.

Figure 17:
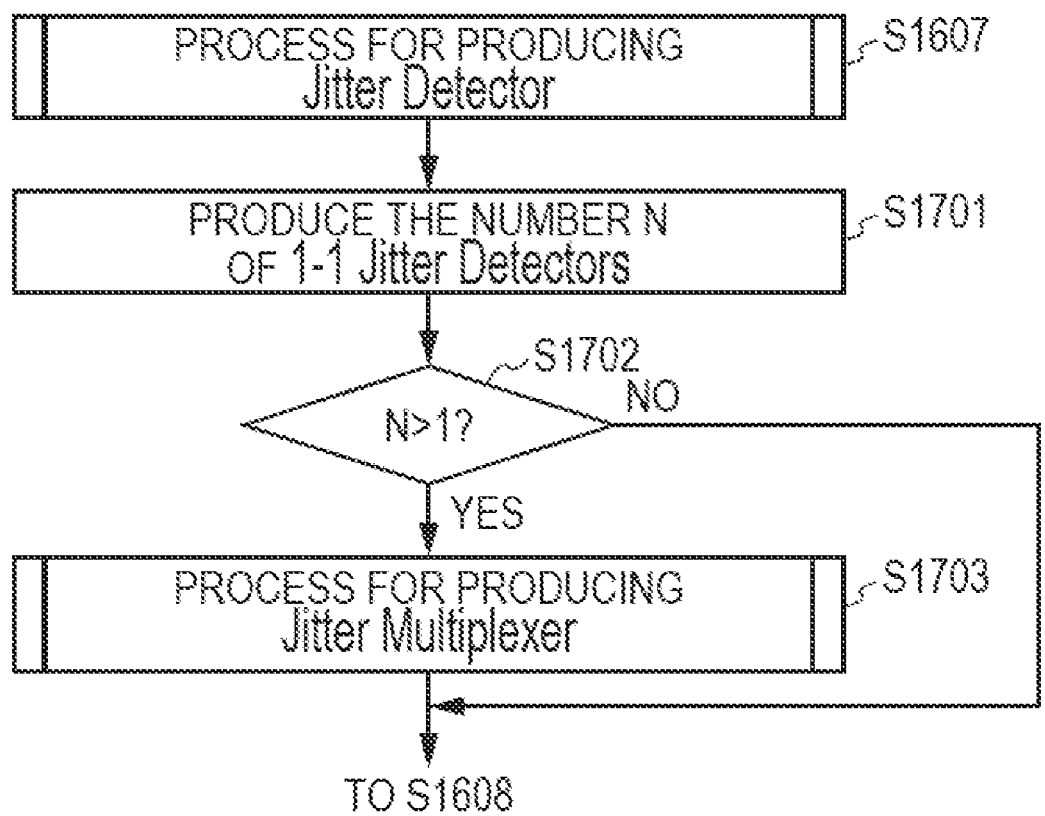
FIG. 17 is a flowchart illustrating a procedure of a process for producing a Jitter Detector.

Next, the process for producing the Jitter Detector described above (step S1607) will be explained. FIG. 17 is a flowchart illustrating a procedure of the process for producing the Jitter Detector. First, as illustrated in FIG. 17, produce the number N of 1-1 Jitter Detectors (step S1701), and identify whether or not N>1 (step S1702). If N>1 (step S1702: Yes), perform a process for producing a Jitter Multiplexer by means of the identifier producing unit 1202 (step S1703), and then move to the step S1608. Meanwhile, unless N>1 (step S1702: No), move to the step S1608.

Figure 18:
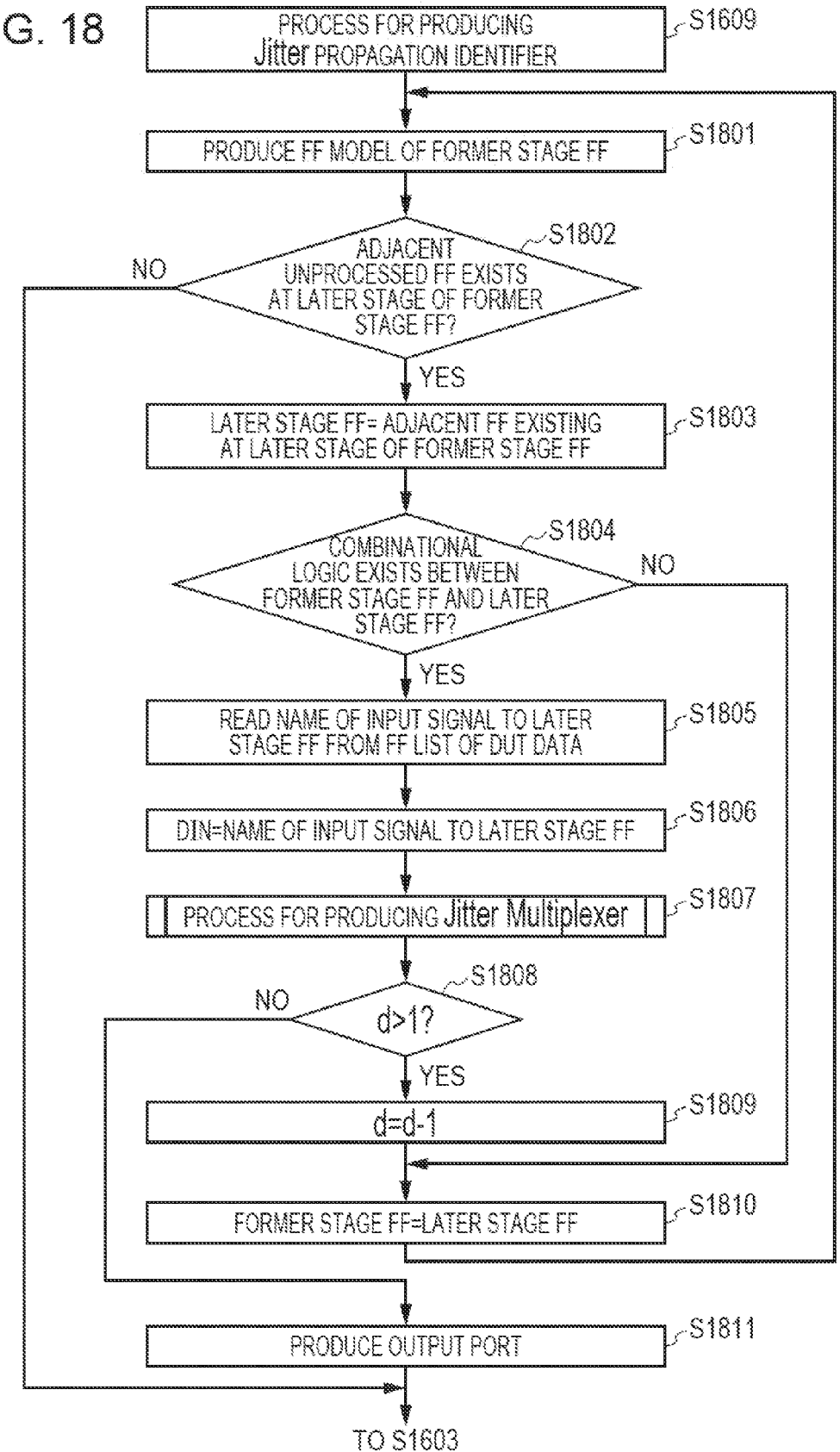
FIG. 18 is a flowchart illustrating a procedure of a process of a Jitter propagation identifier.

Next, the process for producing the Jitter propagation identifier described above (step S1609) will be explained. FIG. 18 is a flowchart illustrating a procedure of a process for producing the Jitter propagation identifier. First, as illustrated in FIG. 18, produce a model of a former stage FF (step S1801), and identify whether an adjacent unprocessed FF exists at a later stage of the former stage FF (step S1802). If it is identified that an adjacent unprocessed FF exists at the later stage of the former stage FF (step S1802: Yes), let the later stage FF=the adjacent unprocessed FF existing at the later stage of the former stage FF (step S1803), and identify whether a combinational logic exists between the former stage FF and the later stage FF (step S1804).

If it is identified that a combinational logic exists between the former stage FF and the later stage FF (step S1804: Yes), read a name of an input signal to the later stage FF from the FF list of the DUT data (step S1805), let DIN=the name of the input signal to the later stage FF (step S1806), and perform a process for producing a Jitter Multiplexer by means of the identifier producing unit 1202 (step S1807). The process for producing a Jitter Multiplexer is a same process as the process of the step S1703 described above. Then, it is identified whether or not d>1 (step S1808). If d>1 is identified (step S1808: Yes), let d=d−1 (step S1809), let the former stage FF=the later stage FF, and return to the step S1801.

Meanwhile, if it is identified that no combinational logic exists between the former stage FF and the later stage FF (step S1804: No), move to the step S1810. Then, unless d>1 is identified (step S1808: No), produce an output port (step S1811), and return to the step S1603. Meanwhile, if it is identified that no adjacent unprocessed FF exists at the later stage of the former stage FF (step S1802: No), return to the step S1603.

Figure 19:
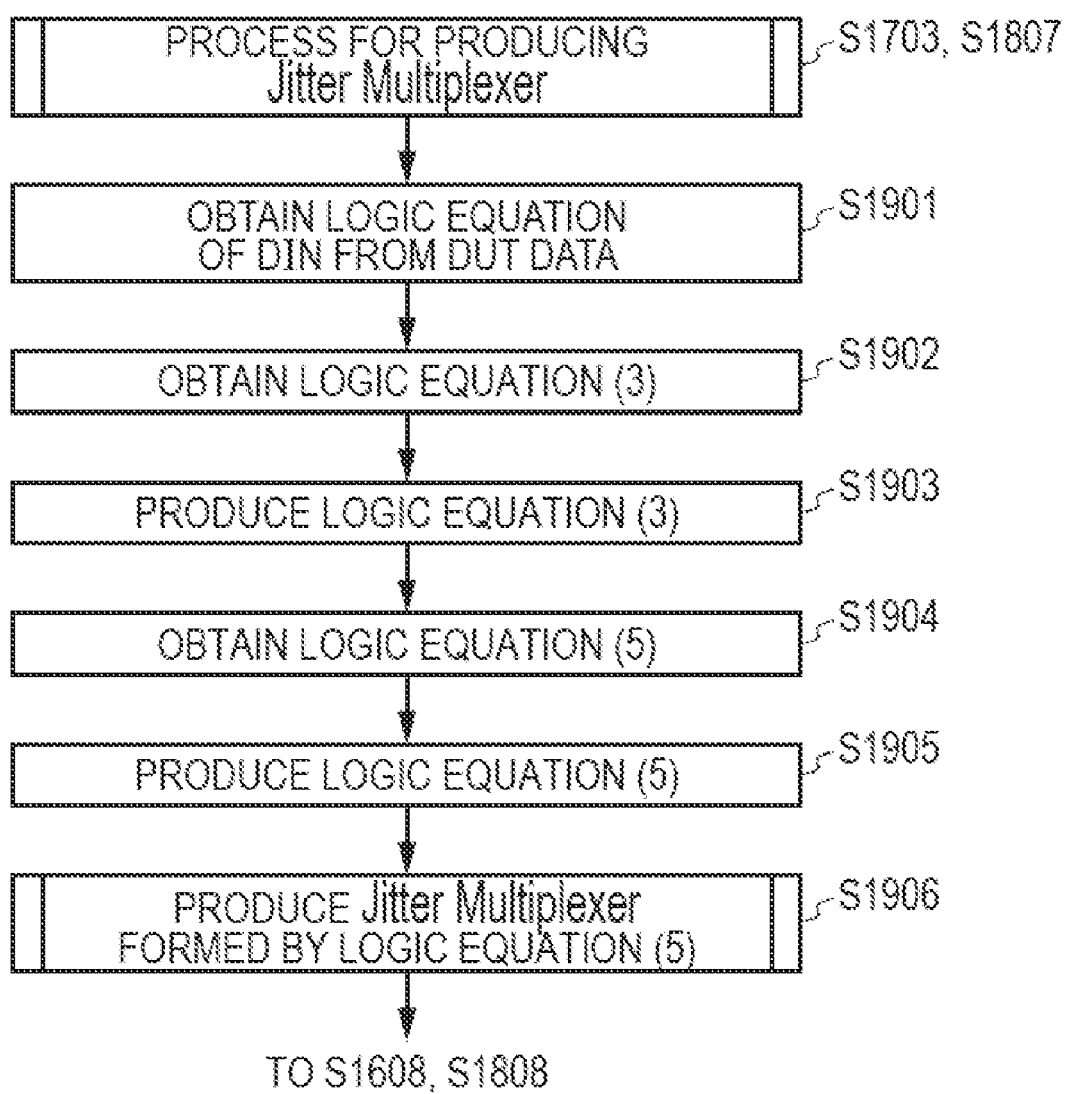
FIG. 19 is a flowchart illustrating a procedure of a process for producing a Jitter Multiplexer.

Next, the process for producing the Jitter Multiplexer described above (step S1703 or step S1807) will be explained. FIG. 19 is a flowchart illustrating a procedure of the process for producing the Jitter Multiplexer. First, as illustrated in FIG. 19, obtain a logic equation of DIN from the DUT data (step S1901). Next, obtain the logic equation (3) (step S1902), and produce the logic equation (3) from the logic equation of DIN by means of the first conversion unit 1203 (step S1903). Then, obtain the logic equation (5) (step S1904), produce the logic equation (5) by means of the second conversion unit 1204 (step S1905), produce the Jitter Multiplexer formed by the logic equation (5) (step S1906) and move to the step S1608 (step S1808).

According to the second embodiment, as described above, the Jitter propagation possibility detector including the output position of the combinational logic as the observation position may be automatically produced. Thus, a workload of a user (which means both who designs and verifies) such as manually making a model may be reduced. Further, it may be identified early whether or not the input pattern is usable for testing an effect of a metastable condition.

Next, the third embodiment will be explained. According to the third embodiment, a change of input data provided to the receiver clock domain is detected. Then, the combinational logic is provided with an indefinite value through an FF if a change occurs in the input data, and the combinational logic is provided with the input data through an FF if no change occurs in the input data. Thus, the indefinite value provided to the combinational logic proves that the change of the input data is propagated to the output of the combinational logic. Incidentally, each of portions which are same as the corresponding ones explained as to the first and second embodiments is given a same reference numeral, and its explanation is omitted.

Figure 20:
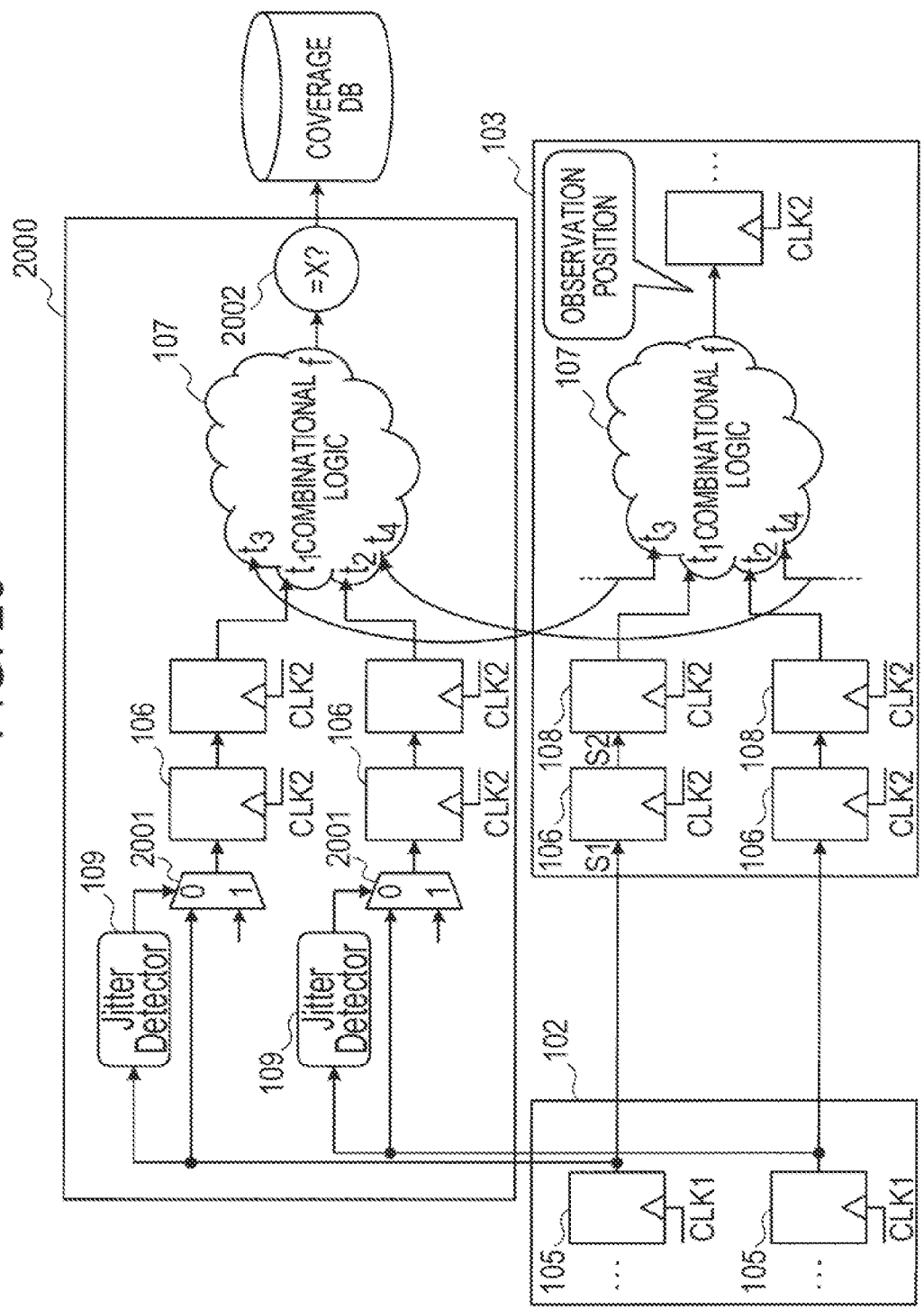
FIG. 20 illustrates a Jitter propagation possibility detector according to a third embodiment.

FIG. 20 illustrates a Jitter propagation possibility detector according to the third embodiment. The Jitter propagation possibility detector 2000 is constituted by a Jitter Detector 109, a selector 2001, FFs of the same number of stages as the receiver clock domain 103, the combinational logic 107 of the receiver clock domain 103 and a comparator 2002. The Jitter propagation possibility detector 2000 is a model for verification.

(A Functional Structure of a Verification Support System)

Figure 21:
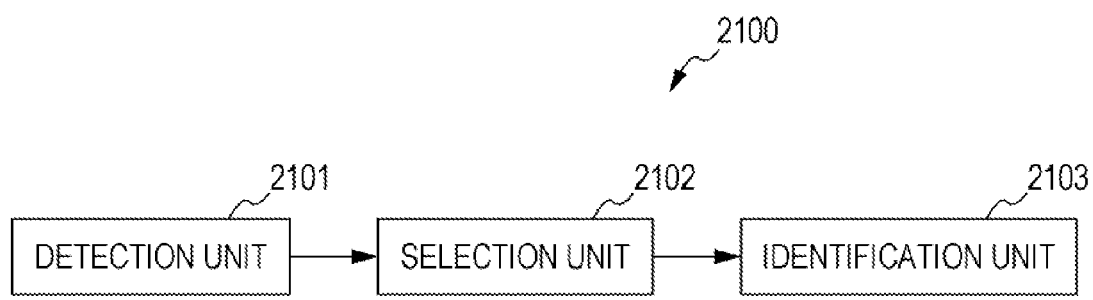
FIG. 21 is a functional block diagram of a verification support system of the third embodiment.

Next, a functional structure of a verification support system will be explained. FIG. 21 is a functional block diagram of a verification support system of the third embodiment. The verification support system 2100 is constituted by including a detection unit 2101, a selection unit 2102 and an identification unit 2103. To put it concretely, e.g., the detection unit 2101, the selection unit 2102 and the identification unit 2103 implement their functions by making the CPU 501 run a program stored in the memory device such as the ROM 502, the RAM 503, the magnetic disk 505 and the optical disk 507 illustrated in FIG. 5, or by means of the I/F 509.

First, the detection unit 2101 detects a change of data transferred from the transmitter clock domain 102 of the verification object circuit 300 to the receiver clock domain 103 and provided to the combinational logic in the receiver clock domain 103.

To put it concretely, e.g., the Jitter Detector 109 detects a change of output data of the transmitter FF 105 similarly as the detection unit 601 of the first embodiment described above.

Next, the selection unit 2102 selects an indefinite value or data provided to the combinational logic in the receiver clock domain 103 in accordance with a result detected by the detection unit 2101, and provides a same combinational logic as the combinational logic in the receiver clock domain 103 with what is selected.

To put it concretely, e.g., if the Jitter Detector 109 detects a change of the data transferred from the receiver clock domain 102 to the receiver clock domain 103, the selector 2001 selects the indefinite value and provides the receiver FF 106 with the indefinite value, and if no change of the data is detected, the selector 2001 selects the data and provides the receiver FF with the data.

If the output of the Jitter Detector 109 is "1", e.g., the selector 2001 selects the indefinite value and provides the receiver FF 106 with the indefinite value. If the output of the Jitter Detector 109 is "0", the selector 2001 selects the data transferred to the receiver clock domain 103 and provides the receiver FF 106 with the data.

If the input data to the same combinational logic provided with a result selected by the selection unit 2102 includes the indefinite value, the identification unit 2103 identifies whether or not output data of the same combinational logic is an indefinite value.

To put it concretely, e.g., the comparator 2002 identifies whether or not the output data of the combinational logic is an indefinite value and outputs what is identified. If a change occurs in the data, as the receiver FF 106 is provided with the indefinite value by the selector 2001, t1 is provided with the indefinite value. Thus, as the comparator 2002 identifies whether or not an indefinite value is output to the output of the combinational logic 107, it may be identified whether or not the change of the data is propagated to the output of the combinational logic 107.

Further, the identification unit 2103 outputs an identified result. To put it concretely, e.g., the identification unit 2103 outputs an identified result in relation to the input pattern. An output form may be, e.g., a display on the display 508, a print output to the printer 513 and transmission to an external device through the I/F 509. Further, the identified result may be stored in the memory device such as the RAM 503, the magnetic disk 505 or the optical disk 507.

(A Procedure of a Verification Support Process of the System 2100)

Figure 22:
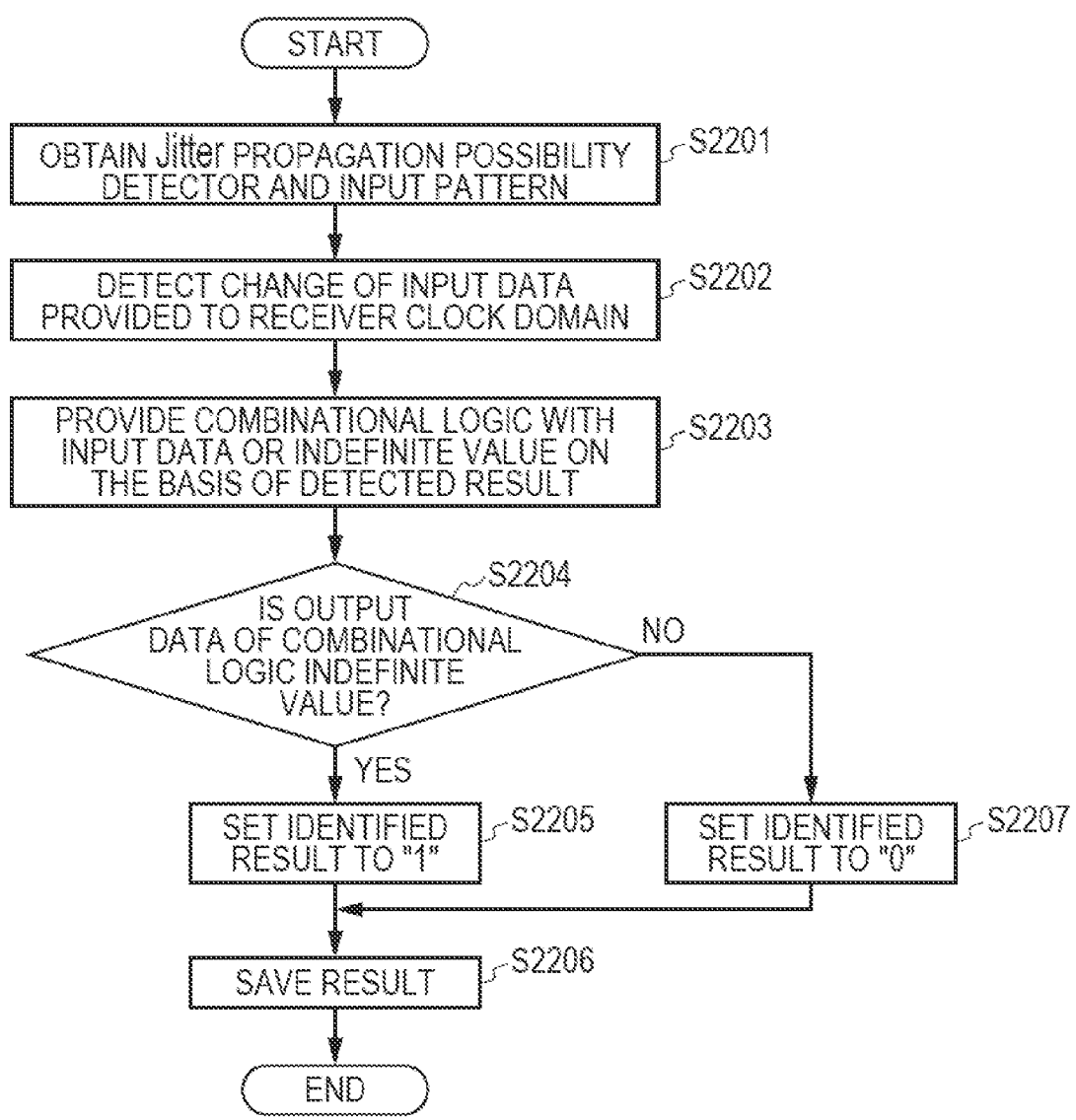
FIG. 22 is a flowchart illustrating a procedure of a verification support process of a verification support system.

A procedure of a verification support process of the verification support system 2100 of the third embodiment will be explained. FIG. 22 is a flowchart illustrating a procedure of a verification support process of the verification support system 2200. First, as illustrated in FIG. 22, obtain a Jitter propagation possibility detector and an input pattern (step S2201), detect a change of the input data provided to the receiver clock domain (step S2202), provide the combinational logic with the input data or an indefinite value on the basis of a detected result by means of the selection unit 2102 (step S2203), and identify whether or not the output data of the combinational logic is an indefinite value by means of the identification unit 2103 (step S2204).

If the output data of the combinational logic is identified as an indefinite value (step S2204: Yes), set an identified result to "1" (step S2205), save the result (step S2206) and end a series of the processes. Meanwhile, if the output data of the combinational logic is identified not as an indefinite value (step S2204: No), set the identified result to "0" (step S2207) and move to the step S2206.

According to the third embodiment, as described above, if a fluctuation occurs in the data transferred from the transmitter clock domain 102 to the receiver clock domain, the combinational logic is provided with an indefinite value, and it is identified whether or not an indefinite value is output to the output of the combinational logic. It may thereby be automatically identified whether the data provided to the receiver clock domain 103 is propagated to the output of the combinational logic in the receiver clock domain 103 or canceled in the combinational logic.

Thus, propagation/cancellation of the fluctuation of the data in the combinational logic may be observed at the output position of the combinational logic. As it may thereby be observed without being affected by another combinational logic, verification accuracy may be raised. Further, as another combinational logic is removed from the object of verification, a period of time for verification may be reduced for that. Moreover, an input pattern being usable for testing a metastable condition even if the combinational logic in the receiver clock domain 103 is complicated may be made.

Further, as compared with the Jitter propagation possibility detector 104 according to the first embodiment, the Jitter propagation possibility detector 2000 according to the third embodiment includes the selection unit 2001 alone and does not need an identifier corresponding to the combinational logic in the receiver clock domain 103, and is thereby simply configured. Thus, in a case where a user manually makes the Jitter propagation possibility detector 2000, the user may easily make it as compared with the Jitter propagation possibility detector 104. Thus, a period of time for verification may be reduced.

Next, the fourth embodiment will be explained. According to the fourth embodiment, the Jitter Detector 109, the selector 2001 and the comparator 2002 are produced so that the Jitter propagation possibility detector of the third embodiment is automatically produced. A user's workload such as manually producing the Jitter propagation possibility detector may thereby be reduced. Incidentally, each of portions which are same as the corresponding ones explained as to the embodiments 1-3 is given a same reference numeral, and its explanation is omitted.

(A Functional Structure of a Verification Support System)

Figure 23:
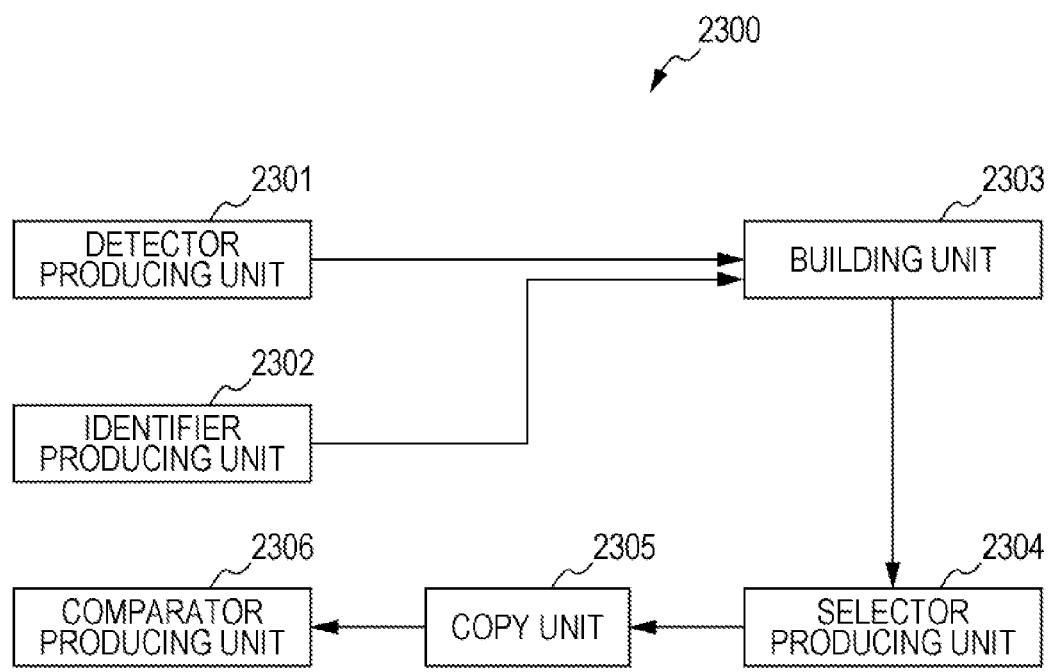
FIG. 23 is a functional block diagram of a verification support system of a fourth embodiment.

Next, a functional structure of a verification support system will be explained. FIG. 23 is a functional block diagram of a verification support system of the fourth embodiment. The verification support system 2300 is constituted by including a detector producing unit 2301, an identifier producing unit 2302, a building unit 2303, a selector producing unit 2304, a copy unit 2305 and a comparator producing unit 2306.

To put it concretely, e.g., the detector producing unit 2301, the identifier producing unit 2302, the building unit 2303, the selector producing unit 2304, the copy unit 2305 and the comparator producing unit 2306 implement their functions by making the CPU 501 run a program stored in the memory device such as the ROM 502, the RAM 503, the magnetic disk 505 and the optical disk 507 illustrated in FIG. 5, or by means of the I/F 509.

The detector producing unit 2301 performs a same process as the detector producing unit 1201 described above. Next, the identifier producing unit 2302 performs a same process as the identifier producing unit 1202 described above. Then, the building unit 2303 performs a same process as the building unit 1205 described above. Explanations of the detector producing unit 2301, the identifier producing unit 2302 and the building unit 2303 are omitted.

Next, the selector producing unit 2304 produces a selector 2001 configured to connect an indefinite value or data provided to the receiver clock domain and input data to the combinational logic in the receiver clock domain in accordance with the output of the detector built by the building unit 2303.

To put it concretely, e.g., the CPU 501 reads a model of a selector stored in the memory device. An example of a logic equation that forms, e.g., a model of a selector is described below.

$$y=(CTRL\&1'bz)|(\sim CTRL\&DATA) \qquad (9)$$

The variable y is an output of the model of the selector. CTRL is a control signal. According to the logic equation (9), y outputs an indefinite value if CTRL is "1", and outputs a value of DATA if CTRL is "0".

The control signal CTRL of the model of the selector is connected to output data of the Jitter Detector. Next, DATA of the model of the selector is connected to the data provided to the combinational logic in the receiver clock domain so that the selector 2001 is produced.

Next, the copy unit 2305 copies the combinational logic in the receiver clock domain 103 and inputs the output data of the selector 2001 produced by the selector producing unit. To put it concretely, e.g., the CPU 501 copies the combinational logic in the verification object circuit 300, and connects the output of the selector 2001 and the input to the copied combinational logic.

Next, the comparator producing unit 2306 produces the comparator 2002 configured to compare the output of the combinational logic in the receiver clock domain copied by the copy unit 2305 and an indefinite value. To put it concretely, e.g., the CPU 501 reads a model of the comparator from the memory device, and connects the output of the copied combinational logic and the input to the model of the comparator so as to produce the comparator 2002.

(A Procedure of a Verification Support Process of the System 2300)

Figure 24:
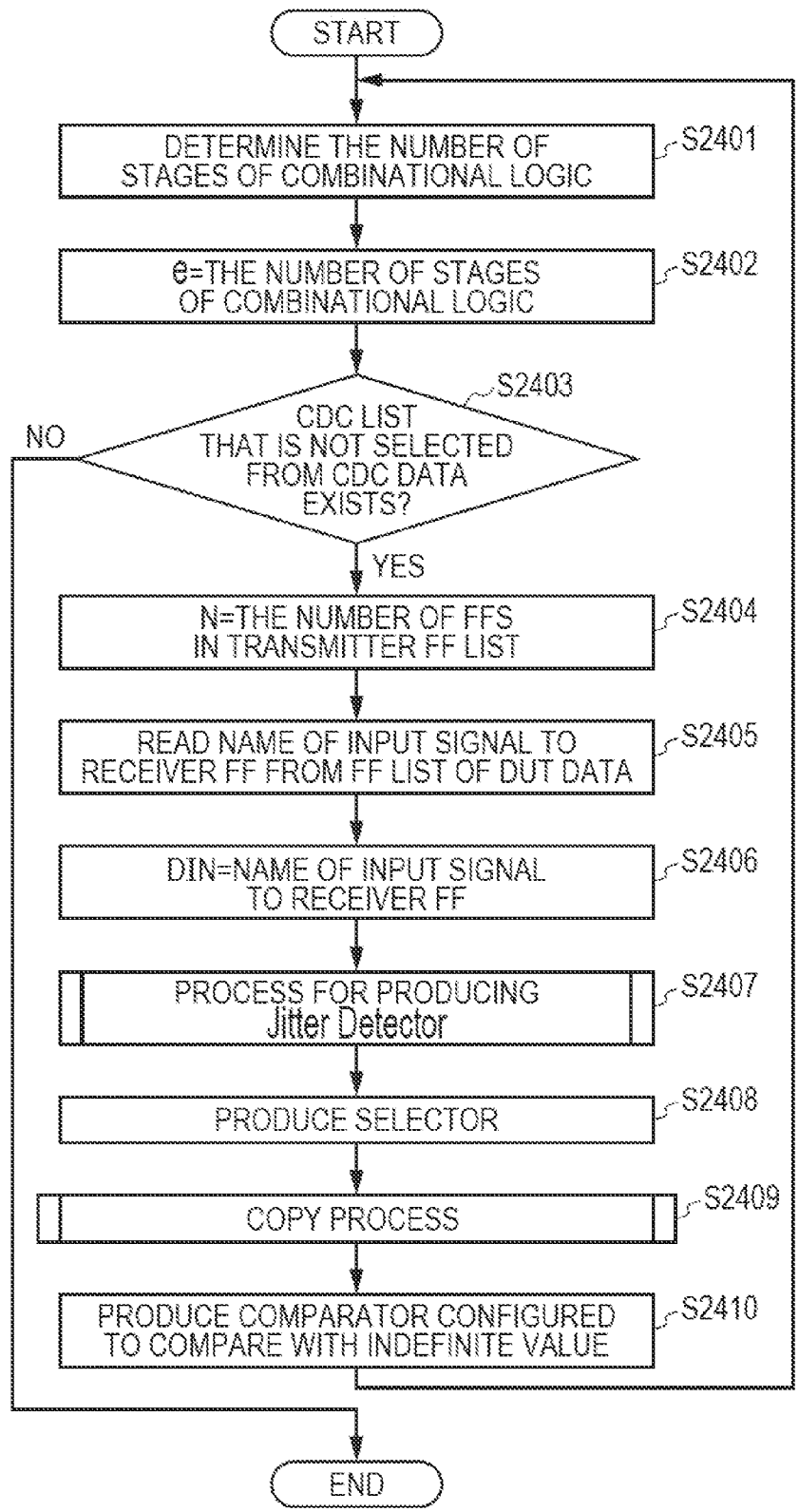
FIG. 24 is a flowchart illustrating a procedure of a verification support process of a verification support system.

A procedure of a verification support process of the verification support system 2300 of the fourth embodiment will be explained. FIG. 24 is a flowchart illustrating a procedure of a verification support process of the verification support system 2300. First, as illustrated in FIG. 24, set the number of stages of the combinational logic (step S2401), let e=the number of stages of the combinational logic (step S2402), and identify whether or not a CDC list not selected from the CDC data exists (step S2403).

If it is identified that a CDC list not selected from the CDC data exists (step S2403: Yes), let N=the number of FFs in the transmitter FF list (step S2404), read a name of an input signal to the receiver FF from the FF list of the DUT data (step S2405), let DIN=the name of the input signal to the receiver FF (step S2406), and perform a process for producing a Jitter Detector by means of the detector producing unit 2301, the identifier producing unit 2302 and the building unit 2303 (step S2407).

The process for producing a Jitter Detector is same as the process for producing a Jitter Detector explained as to the second embodiment (step S1607). Next, produce a selector by means of the selector producing unit 2304 (step S2408), perform a copy process of the combinational logic by means of the copy unit 2305 (step S2409), produce a comparator configured to compare with an indefinite value by means of the comparator producing unit 2306 (step S2410), and return to the step S2401.

Meanwhile, if it is identified that no CDC list not selected from the CDC data exists (step S2403: No), end a series of the processes.

Figure 25:
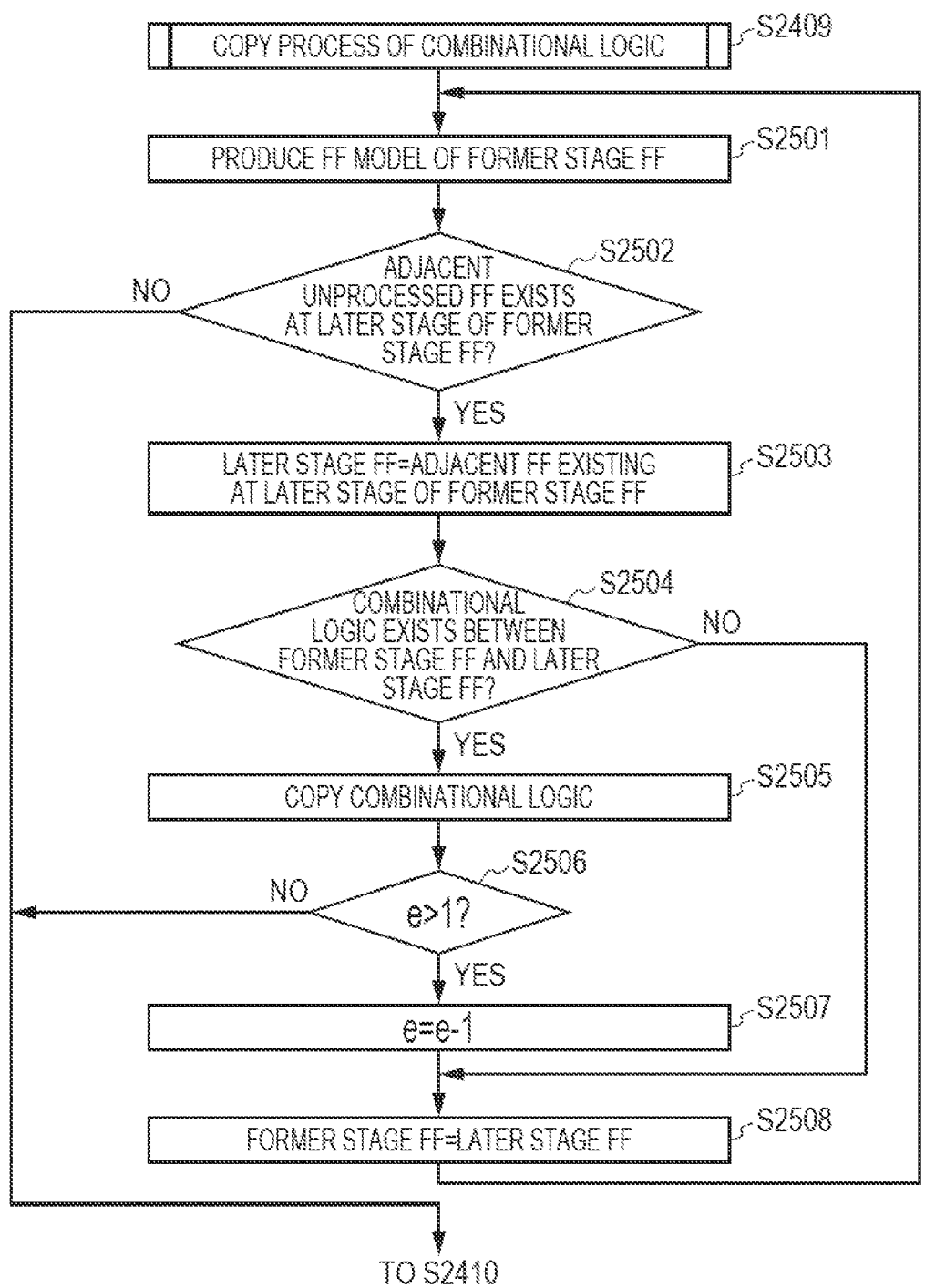
FIG. 25 is a flowchart illustrating a procedure of a copy process of a combinational logic.

Next, the copy process of the logic gate described above (step S2409) will be explained. FIG. 25 is a flowchart illustrating a procedure of the copy process of the combinational logic. First, as illustrated in FIG. 25, produce an FF model of a former stage FF (step S2501), and identify whether or not an adjacent unprocessed FF exists at a later stage of the former stage FF (step S2502). If it is identified that an adjacent unprocessed FF exists at the later stage of the former stage FF (step S2502: Yes), let the later stage FF=the adjacent FF that exists at the later stage of the former stage FF (step S2503), and it is identified whether or not a combinational logic exists between the former stage FF and the later stage FF (step S2504).

If it is identified that a combinational logic exists between the former stage FF and the later stage FF (step S2504: Yes), copy the combinational logic (step S2505), and identify whether or not e>1 (step S2506). If e>1 is identified (step S2506: Yes), let e=e-1 (step S2507), let the former stage FF=the later stage FF (step S2508) and return to the step S2501.

Meanwhile, if it is identified that no combinational logic exists between the former stage FF and the later stage FF (step S2504: No), move to the step S2508. Meanwhile, if it is identified that e>1 is not concluded (step S2506: No), move to the step S2410. Meanwhile, if it is identified that no adjacent unprocessed FF exists at the later stage of the former stage FF (step S2502: No), move to the step S2410.

According to the fourth embodiment, as described above, the Jitter propagation possibility detector 2000 of the third embodiment is automatically produced. A model in which an output position of any one of the combinational logics in the receiver clock domain may be made the observation position is automatically produced. A user's workload such as manually making a model may thereby be reduced. Further, it may be identified early whether or not the input pattern is usable for testing an effect of a metastable condition.

Next, according to the fifth embodiment, an input pattern made by means of a Jitter propagation detector is used for comparing a verified result after a change of the model of the receiver FF in the receiver clock domain and a verified result before the change of the model. Incidentally, each of portions which are same as the corresponding ones explained as to the embodiments 1-4 is given a same reference numeral, and its explanation is omitted.

Figure 26:
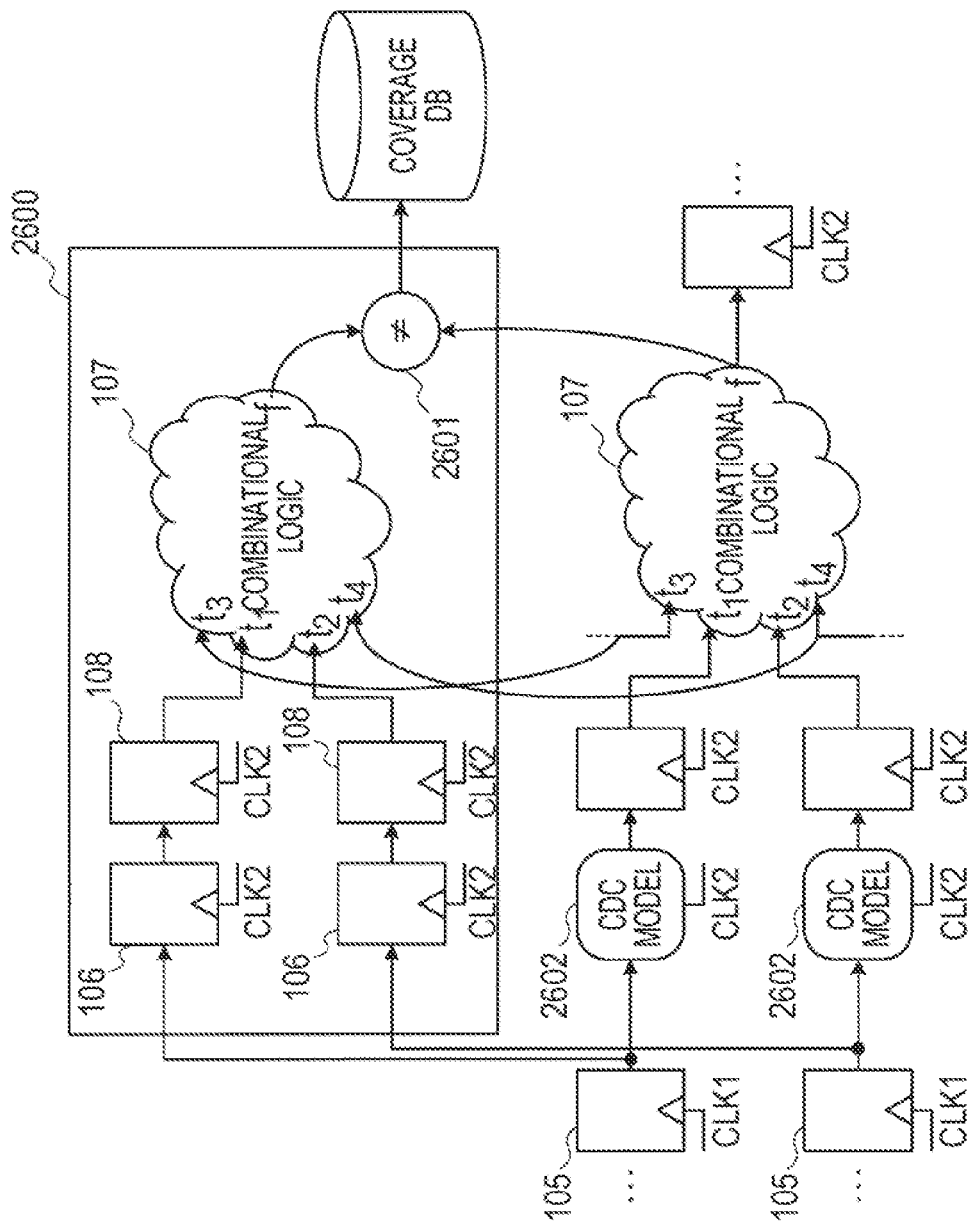
FIG. 26 illustrates a Jitter propagation detector.

FIG. 26 illustrates a Jitter propagation detector. The Jitter propagation detector 2600 is constituted by including the receiver FF 106 in the receiver clock domain 103, the FF 108, the combinational logic 107 and an identifier 2601. In the Jitter propagation detector 2600, as an example, the output position of the combinational logic 107 is made an observation position. Thus, the output data of the combinational logic 107 is provided to the identifier 2601. The Jitter propagation detector 2600 is a model for verification.

Thus, if an output of another combinational logic in the receiver clock domain 103 is made the observation position, output data of that combinational logic is provided to the identifier 2601.

(A Functional Structure of a Verification Support System)

Figure 27:
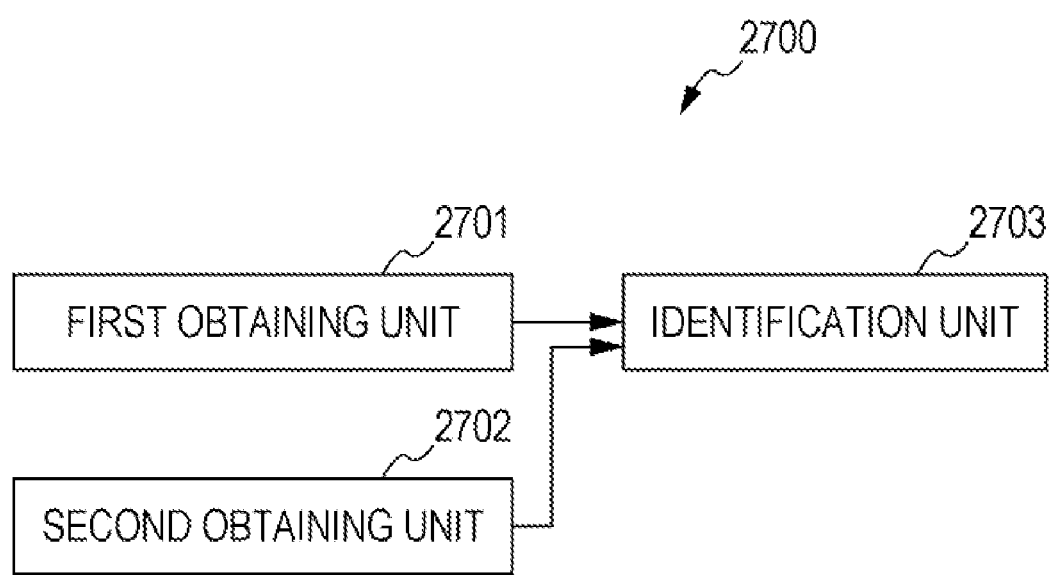
FIG. 27 is a functional block diagram of a verification support system of a fifth embodiment.

Next, a functional structure of a verification support system will be explained. FIG. 27 is a functional block diagram of a verification support system of the fifth embodiment. The verification support system 2700 is constituted by including a first obtaining unit 2701, a second obtaining unit 2702 and an identification unit 2703. To put it concretely, e.g., the first obtaining unit 2701, the second obtaining unit 2702 and the identification unit 2703 implement their functions by making the CPU 501 run a program stored in the memory device such as the ROM 502, the RAM 503, the magnetic disk 505 and the optical disk 507 illustrated in FIG. 5, or by means of the I/F 509.

The first obtaining unit 2701 obtains output data of a combinational logic provided with data transferred from the transmitter clock domain of the verification object circuit 300 to the receiver clock domain through a receiver FF in the receiver clock domain. To put it concretely, e.g., the CPU 501 accesses the verification object circuit 300, and obtains the output data of the combinational logic provided through the receive FF in the receiver clock domain.

The second obtaining unit 2702 obtains output data of a same combinational logic as a combinational logic provided with data through a model of a receiver FF that may simulate an effect of a metastable condition in the receiver clock domain. To put it concretely, e.g., the CPU 501 obtains output data of a same combinational logic as a combinational logic that accesses the verification object circuit 300, provided with an input through a model of a receiver FF that may simulate an effect of a metastable condition and obtained by the first obtaining unit 2701.

The identification unit 2703 identifies whether or not output data obtained by the first obtaining unit 2701 and by the second obtaining unit 2702 agree with each other and outputs what is identified. To put it concretely, e.g., the CPU 501 compares the output data obtained by the first obtaining unit 2701 and by the second obtaining unit 2702, and outputs "1" and "0" if they agree and disagree with each other, respectively.

Further, the identification unit 2703 outputs an identified result. To put it concretely, e.g., the identification unit 2703 outputs an identified result in relation to the input pattern. An output form may be, e.g., a display on the display 508, a print output to the printer 513 and transmission to an external device through the I/F 509. Further, the identified result may be stored in the memory device such as the RAM 503, the magnetic disk 505 or the optical disk 507.

(A Procedure of a Verification Support Process of the System 2700)

Figure 28:
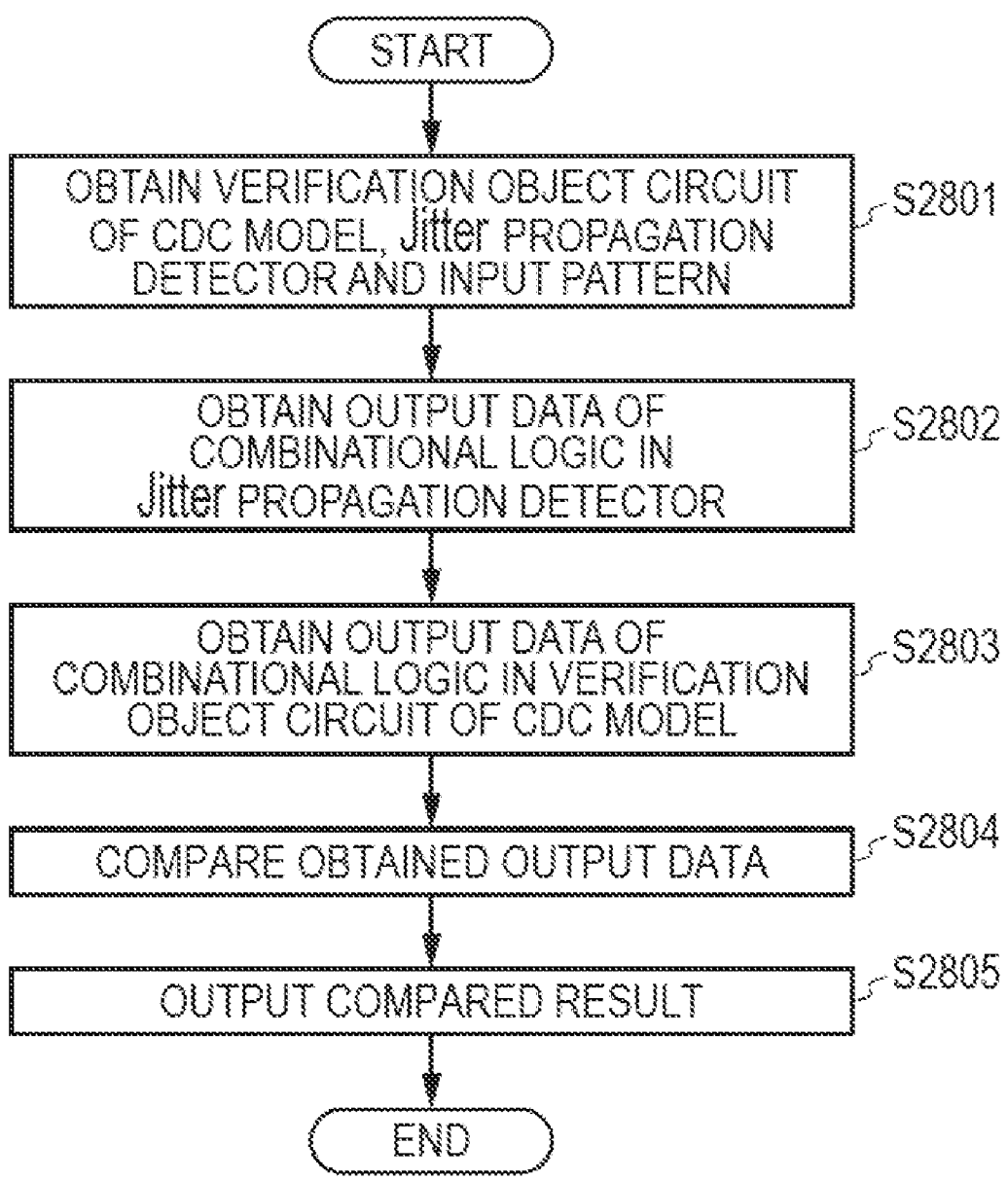
FIG. 28 is a flowchart illustrating a procedure of a verification support process of a verification support system.

A procedure of a verification support process of the verification support system 2700 of the fifth embodiment will be explained. FIG. 28 is a flowchart illustrating a procedure of a verification support process of the verification support system 2700. First, as illustrated in FIG. 2, obtain a verification object circuit of the CDC model, the Jitter propagation detector and the input pattern (step S2801), obtain output data of the combinational logic in the Jitter propagation detector by means of the first obtaining unit 2701 (step S2802), obtain output data of the combinational logic in the verification object circuit of the CDC model (step S2803), compare the obtained output data (step S2804), output a compared result (step S2805) and end a series of the processes.

According to the fifth embodiment, as described above, it may be identified whether a result simulated by the verification object circuit 300 and a result simulated in a case where the receiver FF in the receiver clock domain is changed to a model that may simulate an effect of a metastable condition agree with each other by means of the Jitter propagation detector. It may thereby be automatically verified whether or not the effect of the metastable condition is propagated to the output of the combinational logic. Thus, it may be verified at a proper position whether or not the effect of the metastable condition causes a failure in the circuit operation, so that verification accuracy may be raised.

Then, as to the sixth embodiment, a verification support program for automatically producing the Jitter propagation detector will be explained. Incidentally, each of portions which are same as the corresponding ones explained as to the embodiments 1-5 is given a same reference numeral, and its explanation is omitted.

(A Functional Structure of a Verification Support System)

Figure 29:
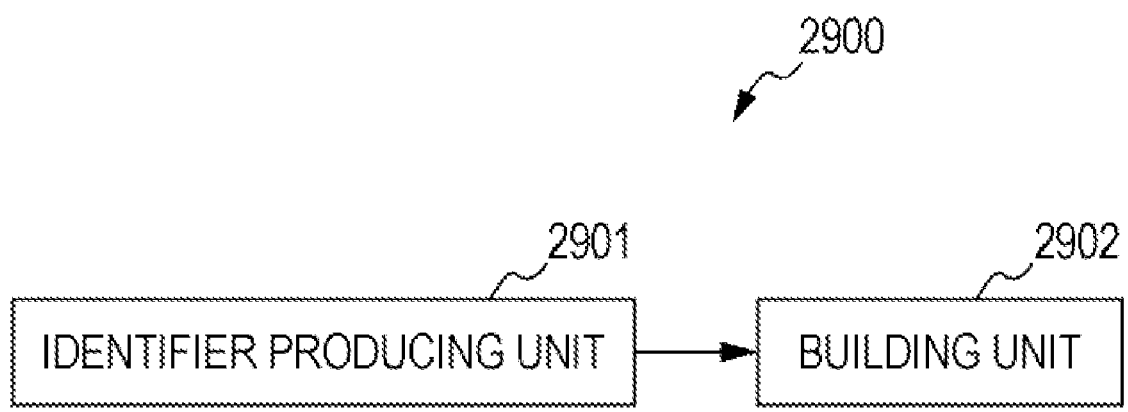
FIG. 29 is a functional block diagram of a verification support system of a sixth embodiment.

Next, a functional structure of a verification support system will be explained. FIG. 29 is a functional block diagram of a verification support system of the sixth embodiment. The verification support system 2900 is constituted by including an identifier producing unit 2901 and a building unit 2902. To put it concretely, e.g., the identifier producing unit 2901 and the building unit 2902 implement their functions by making the CPU 501 run a program stored in the memory device such as the ROM 502, the RAM 503, the magnetic disk 505 and the optical disk 507 illustrated in FIG. 5, or by means of the I/F 509.

The identifier producing unit 2901 produces an identifier configured to identify whether or not output data of a combinational logic provided with data transferred from the transmitter clock domain of the verification object circuit 300 to the receiver clock domain through a receiver FF in the receiver clock domain, and output data of a same combinational logic as a combinational logic provided with data through a model of a receiver FF that may simulate an effect of a metastable condition in the receiver clock domain agree with each other. To put it concretely, e.g., the CPU 501 reads from the memory device a model of an identifier configured to identify whether or not two input data agree with each other so as to produce the identifier.

The building unit 2902 builds a detector configured to connect output data of the combinational logic and output data of a same combinational logic with the input to the identifier produced by the identifier producing unit 2901 so as to detect agreement between the output data. To put it concretely, e.g., the CPU 501 connects the input to the produced identifier 2601 with the output data of the combinational logic and the output data of the same combinational logic.

(A Procedure of a Verification Support Process of the System 2900)

Figure 30:
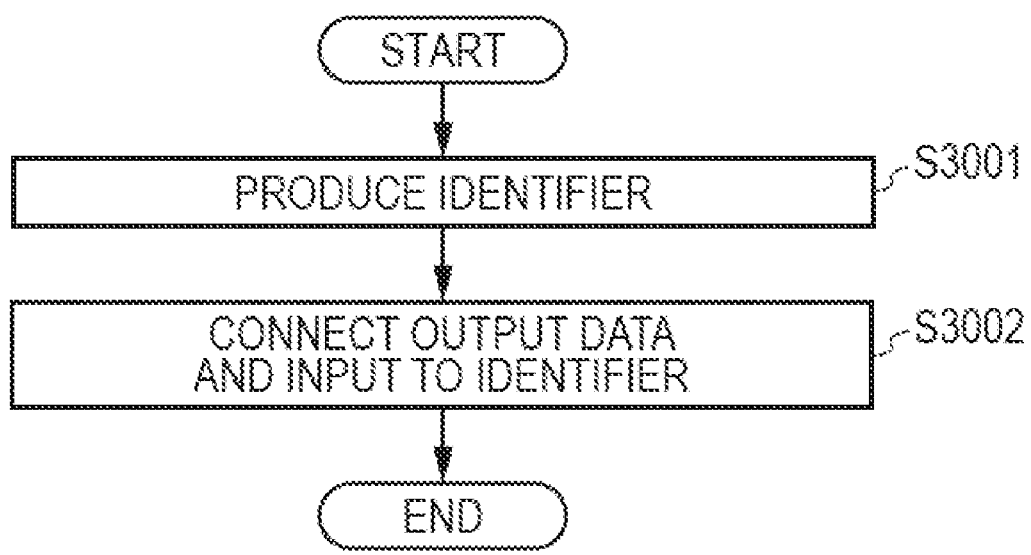
FIG. 30 is a flowchart illustrating a procedure of a verification support process of a verification support system.

A procedure of a verification support process of the verification support system 2900 of the sixth embodiment will be explained. FIG. 30 is a flowchart illustrating a procedure of a verification support process of the verification support system 2900. First, as illustrated in FIG. 30, produce an identifier by means of the identifier producing unit 2901 (step S3001), connect the output data of the Jitter propagation detector and the combinational logic in the verification object circuit of the CDC model with the input to the identifier (step S3002), and end a series of the processes.

According to the sixth embodiment, as described above, the Jitter propagation detector is automatically produced. Thus, an output position of any combinational logic may be easily verified as an observation position. Thus, verification accuracy may be raised.

According to the verification support method, the verification support system and a computer readable storage medium, propagation of an effect of a metastable condition is observed at an output position of a combinational logic so that an input pattern of a high verification effect may be chosen, and consequently effects of raised verification accuracy and of a reduced period of time for verification may be enjoyed.

To put it concretely, according to the verification support program and the verification support system of the first embodiment, a fluctuation of data transferred from the transmitter clock domain of the verification object circuit to the receiver clock domain and provided to the combinational logic in the receiver clock domain is detected, and it is identified whether or not the detected fluctuation of the data is propagated to the output of the combinational logic in accordance with the output data of the combinational logic, and an identified result is output.

The fluctuation of data may thereby be observed at the output position of the combinational logic so that verification accuracy may be raised. Thus, it may be observed at a proper position so that a period of time for verification may be reduced.

According to the verification support program and the verification support system of the second embodiment, as described above, a detector configured to detect a fluctuation of data and an identifier configured to identify whether or not the fluctuation of data is propagated to the combinational logic are produced and built. A detector including an observation position at the output of the combinational logic may thereby be automatically produced. Thus, a user's workload such as manually making a model may be reduced.

Further, if the data transferred from the transmitter clock domain to the receiver clock domain is provided to the combinational logic in the receiver clock domain that is set as an observation position through another combinational logic, an identifier corresponding to all the combinational logics up to the combinational logic set as the observation position is produced and built.

Thus, a detector that may make an output of any combinational logic an observation position may be automatically produced, and verification accuracy may be raised.

Further, as a logic equation of a combinational logic is converted into a logic equation having a coefficient indicating whether or not propagation exists and given a particular value in accordance with a fluctuation of data, even a logic equation of a complicated combinational logic may be automatically converted into a logic equation usable for identifying whether or not the fluctuation of data is propagated. Thus, a user's workload such as manually making a model may be reduced.

According to the verification support program and the verification support system of the third embodiment, as described above, an indefinite value or transferred data is selected in accordance with a fluctuation of data and is provided to a combinational logic in the receiver clock domain for identifying whether or not an indefinite value is output at the output of the combinational logic.

Thus, propagation/cancellation of the fluctuation of data may be observed at the output position of the combinational logic. Hence, as it may be observed without being affected by another combinational logic, verification accuracy may be raised. Further, as another combinational logic is removed from the object of verification, a period of time for verification may be reduced for that.

According to the verification support program and the verification support system of the fourth embodiment, as described above, a detector configured to detect a fluctuation of data, a selector configured to select an indefinite value or transferred data in accordance with the detector output, and a comparator configured to transfer the output data of the selector to the combinational logic in the receiver clock domain so as to compare the output of the combinational logic with the indefinite value are produced.

Thus, a model that may make an output position of any combinational logic in the receiver clock domain an observation position may be automatically produced. Thus, a user's workload such as manually making a model may be reduced. Further, it may be identified early whether or not the input pattern is usable for testing an effect of a metastable condition.

According to the verification support program and the verification support system of the fifth embodiment, as described above, it is identified whether or not an output of a combinational logic before a model of the receiver FF changes agrees with an output of the combinational logic after the model of the receiver FF changes.

Thus, it may be automatically verified whether or not an effect of a metastable condition is propagated to the output of the combinational logic. Hence, it may be verified at a proper position whether or not the effect of the metastable condition causes a failure in circuit operation, and verification accuracy may be raised.

According to the verification support program and the verification support system of the sixth embodiment, as described above, an identifier configured to identify whether or not an output of a combinational logic before a model of the receiver FF changes agrees with an output of the combinational logic after the model of the receiver FF changes. Thus, an output of any combinational logic may easily be made an observation position, and verification accuracy may be raised.

Incidentally, the verification support method of the embodiment described above may be implemented by one or more computers such as a personal computer or a workstation running a program prepared in advance. The verification support program is stored in a computer-readable storage medium such as a hard disk, a flexible disk, a CD-ROM, an MO or a DVD, and is read from the storage medium and run by the computer. Further, the verification support program may be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A verification support system for supporting logic verification of a circuit including a transmitter clock domain and a receiver clock domain, the transmitter clock domain including a plurality of logic gates driven by a transmitter clock and a plurality of outputs for transmitting data, the receiver clock domain including a plurality of logic gates driven by a receiver clock, a plurality of inputs coupled to the outputs of the transmitter domain for receiving transmitted data, and a combinational logic coupled to at least one of the logic gates of the receiver domain, the system comprising:
   a detector for receiving data to be transmitted from the transmitter clock domain, and for detecting a fluctuation of the received data due to any timing fluctuation responsive to the transmitter clock; and
   an identification unit for identifying whether or not any fluctuation of the data determined by the detector is propagated to the output of the combinational logic on the basis of propagation of the received data through at least one of the logic gates of the receiver clock domain to the combinational logic so as to determine any fluctuation of data that is to be inputted to the combinational logic.

2. A verification support system according to claim 1, further comprising;
   a first producing unit for producing the detector configured to detect a fluctuation of data transferred from a transmitter flip-flop in the transmitter clock domain of the circuit to a receiver flip-flop in the receiver clock domain and provided to the combinational logic in the receiver clock domain for every transmitter flip-flop;
   a second producing unit for producing the identification unit using a logic equation usable for identifying whether or not a fluctuation of data is propagated to the output of the combinational logic; and
   a building unit for building a propagation possibility detection unit configured to provide the identification unit with the output data of the detector and the propagation of the received data.

3. The verification support system according to claim 2, wherein the building unit builds the propagation possibility detection unit such that the identification unit is provided with the output data of the detector of another combinational logic, if the combinational logic is provided with data through another combinational logic in the circuit.

4. The verification support system according to claim 2, further comprising:
   a first conversion unit for converting the logic equation of the combinational logic into a logic equation including a selection circuit configured to select a coefficient or data indicating whether or not propagation exists in accordance with the output data of the detector and a combinational logic provided with the output of the selection circuit; and
   a second conversion unit for converting the logic equation converted by the first conversion unit into a logic equation excluding same logic with the combinational logic by giving the coefficient indicating whether or not propagation exists in the logic equation a particular value.

5. A verification support method for supporting logic verification of a circuit including a transmitter clock domain and a receiver clock domain, the transmitter clock domain including a plurality of logic gates driven by a transmitter clock and a plurality of outputs for transmitting data, the receiver clock domain including a plurality of logic gates driven by a receiver clock, a plurality of inputs coupled to the outputs of the transmitter domain for receiving transmitted data, and a combinational logic coupled to at least one of the logic gates of the receiver domain, the method comprising:

receiving data to be transmitted from the transmitter clock domain;

detecting a fluctuation of the received data due to any timing fluctuation responsive to the transmitter clock; and identifying whether or not any fluctuation of the data determined by the detection is propagated to the output of the combinational logic on the basis of propagation of the received data through at least one of the logic gates of the receiver clock domain to the combinational logic so as to determine any fluctuation of data that is to be inputted to the combinational logic.

6. A verification support method according to claim 5, further comprising:

producing a detector configured to detect a fluctuation of data transferred from a transmitter flip-flop in a transmitter clock domain of the circuit to a receiver flip-flop in a receiver clock domain and provided to a combinational logic in the receiver clock domain for every transmitter flip-flop;

producing an identification unit using a logic equation usable for identifying whether or not a fluctuation of data is propagated to the output of the combinational logic; and building a propagation possibility detection unit configured to provide the identification with the output data of the detection and the propagation of the received data.

7. The verification support method according to claim 6, further comprising:

building the propagation possibility detection unit such that the identification unit is provided with the output data of the detector of another combinational logic, if the combinational logic is provided with data through another combinational logic in the circuit.

8. The verification support method according to claim 6, further comprising:

converting the logic equation of the combinational logic into a logic equation including a selection circuit configured to select a coefficient or data indicating whether or not propagation exists in accordance with the output data of the detector and a combinational logic provided with the output of the selection circuit; and converting the logic equation converted by the first conversion unit into a logic equation excluding same logic with the combinational logic by giving the coefficient indicating whether or not propagation exists in the logic equation a particular value.

9. A storage medium storing a verification support program allowing a processor of a computer to execute logic verification of a circuit including a transmitter clock domain and a receiver clock domain, the transmitter clock domain including a plurality of logic gates driven by a transmitter clock and a plurality of outputs for transmitting data, the receiver clock domain including a plurality of logic gates driven by a receiver clock, a plurality of inputs coupled to the outputs of the transmitter domain for receiving transmitted data, and a combinational logic coupled to at least one of the logic gates of the receiver domain, the program allowing the processor to execute an operation, the operation comprising:

receiving data to be transmitted from the transmitter clock domain;

detecting a fluctuation of the received data due to any timing fluctuation responsive to the transmitter clock; and identifying whether or not any fluctuation of the data detected by the detection is propagated to the output of the combinational logic on the basis of propagation of the received data through at least one of the logic gates of the receiver clock domain to the combinational logic so as to determine any fluctuation of data that is to be inputted to the combinational logic.

10. The storage medium according to claim 9, further comprising:

producing a detector configured to detect a fluctuation of data transferred from a transmitter flip-flop in a transmitter clock domain of the circuit to a receiver flip-flop in a receiver clock domain and provided to a combinational logic in the receiver clock domain for every transmitter flip-flop; and producing an identification unit using a logic equation usable for identifying whether or not a fluctuation of data is propagated to the output of the combinational logic;

building a propagation possibility detection unit configured to provide the identification unit with the output data of the detector and the propagation of the received data.

11. The storage medium according to claim 10, further comprising:

building the propagation possibility detection unit such that the identification unit is provided with the output data of the detector of another combinational logic, if the combinational logic is provided with data through another combinational logic in the circuit.

12. The storage medium according to claim 10, further comprising:

converting the logic equation of the combinational logic into a logic equation including a selection circuit configured to select a coefficient or data indicating whether or not propagation exists in accordance with the output data of the detector and a combinational logic provided with the output of the selection circuit; and converting the logic equation converted by the conversion into a logic equation excluding same logic with the combinational logic by giving the coefficient indicating whether or not propagation exists in the logic equation a particular value.

* * * * *